United States Patent
Jeong et al.

(10) Patent No.: US 11,804,321 B2
(45) Date of Patent: Oct. 31, 2023

(54) TUNABLE TEMPLATING LAYERS FOR PERPENDICULARLY MAGNETIZED HEUSLER FILMS

(71) Applicants: Samsung Electronics Co., Ltd., Gyeonggi-do (KR); INTERNATIONAL BUSINESS MACHINES CORPORATION, Armonk, NY (US)

(72) Inventors: Jaewoo Jeong, San Jose, CA (US); Panagiotis Charilaos Filippou, San Jose, CA (US); Yari Ferrante, San Jose, CA (US); Chirag Garg, San Jose, CA (US); Stuart Stephen Papworth Parkin, San Jose, CA (US); Mahesh Samant, San Jose, CA (US)

(73) Assignee: Samsung Electronics Co., Ltd., Yongin-si (KR)

( * ) Notice: Subject to any disclaimer, the term of this patent is extended or adjusted under 35 U.S.C. 154(b) by 524 days.

(21) Appl. No.: 17/100,719

(22) Filed: Nov. 20, 2020

(65) Prior Publication Data
US 2022/0165469 A1    May 26, 2022

(51) Int. Cl.
*H01F 10/32* (2006.01)
*H01F 41/32* (2006.01)
(Continued)

(52) U.S. Cl.
CPC ....... *H01F 10/3254* (2013.01); *C23C 14/185* (2013.01); *C23C 14/35* (2013.01); *C30B 23/025* (2013.01); *C30B 23/08* (2013.01); *C30B 29/52* (2013.01); *C30B 30/04* (2013.01); *C30B 33/02* (2013.01); *H01F 10/30* (2013.01); *H01F 10/3272* (2013.01); *H01F 41/32* (2013.01); *H10B 61/00* (2023.02); *H10N 50/00* (2023.02); *H10N 50/10* (2023.02)

(58) Field of Classification Search
CPC ...... H01F 10/3254; H01F 10/30; H01F 41/32; H10N 50/00; H10N 50/10; H10B 61/00
USPC ......................................................... 257/421
See application file for complete search history.

(56) References Cited

U.S. PATENT DOCUMENTS 6,834,005 B1    12/2004   Parkin
9,048,412 B2     6/2015   Oh
(Continued)

FOREIGN PATENT DOCUMENTS

CN          107403821          1/2020

*Primary Examiner* — Jami Valentine Miller
(74) *Attorney, Agent, or Firm* — Lewis Roca Rothgerber Christie LLP

(57) ABSTRACT

A device including a templating structure and a magnetic layer on the templating structure is described. The templating structure includes D and E. A ratio of D to E is represented by $D_{1-x}E_x$, with x being at least 0.4 and not more than 0.6. E includes a main constituent. The main constituent includes at least one of Al, Ga, and Ge. Further, E includes at least fifty atomic percent of the main constituent. D includes at least one constituent that includes Ir, D includes at least 50 atomic percent of the at least one constituent. The templating structure is nonmagnetic at room temperature. The magnetic layer includes at least one of a Heusler compound and an $L1_0$ compound, the magnetic layer being in contact with the templating structure.

20 Claims, 12 Drawing Sheets

(51) Int. Cl.
*C30B 33/02* (2006.01)
*C23C 14/18* (2006.01)
*C30B 29/52* (2006.01)
*C30B 23/02* (2006.01)
*C23C 14/35* (2006.01)
*C30B 23/08* (2006.01)
*C30B 30/04* (2006.01)
*H10N 50/00* (2023.01)
*H01F 10/30* (2006.01)
*H10B 61/00* (2023.01)
*H10N 50/10* (2023.01)

(56) References Cited

U.S. PATENT DOCUMENTS

| | | |
|---|---|---|
| 9,236,564 B2 | 1/2016 | Carey |
| 9,929,211 B2 | 3/2018 | Zhu |
| 10,121,497 B1 * | 11/2018 | Takahashi .............. G11B 5/235 |
| 10,177,305 B2 | 1/2019 | Jeong |
| 10,193,062 B2 | 1/2019 | Iwata |
| 10,395,708 B2 | 8/2019 | Jung |
| 10,396,123 B2 | 8/2019 | Jeong |
| 2015/0132608 A1 * | 5/2015 | Kataoka ................ G11B 5/653 |
| | | 428/829 |
| 2019/0019943 A1 | 1/2019 | Min |
| 2019/0027680 A1 | 1/2019 | Min |
| 2021/0125651 A1 * | 4/2021 | Wang ..................... G06N 3/065 |
| 2022/0165938 A1 * | 5/2022 | Jeong ................... G11C 11/161 |

\* cited by examiner

X₃Z Heusler on AE CsCl-type CTL

TUNABLE TEMPLATING LAYERS FOR PERPENDICULARLY MAGNETIZED HEUSLER FILMS

BACKGROUND OF THE INVENTION

Heusler compounds are a class of materials having the representative formula $X_2YZ$, where X and Y are transition metals or lanthanides, and Z is from a main group element. Due to the chemical distinction between X (or Y) and Z, they form a unique structure defined by the space group symmetry $L2_1$ (or $D0_{22}$ when they are tetragonally distorted), where four face-centered cubic structures penetrate each other. The properties of Heusler compounds are strongly dependent on the atomic ordering of the elements constituting the compounds. Thus, the fabrication of high quality Heusler films typically requires high temperature thermal processes: for example, deposition at temperatures significantly above room temperature and/or thermal annealing at high temperatures (200° C. or higher). Such high deposition temperatures may adversely affect the properties of other portions of the device in which the Heusler compound is desired to be used. However, Heusler compounds and $L1_0$ compounds have still attracted interest as candidate materials for various spintronic applications.

BRIEF DESCRIPTION OF THE DRAWINGS

Various embodiments of the invention are disclosed in the following detailed description and the accompanying drawings.

DETAILED DESCRIPTION

Figure 1:
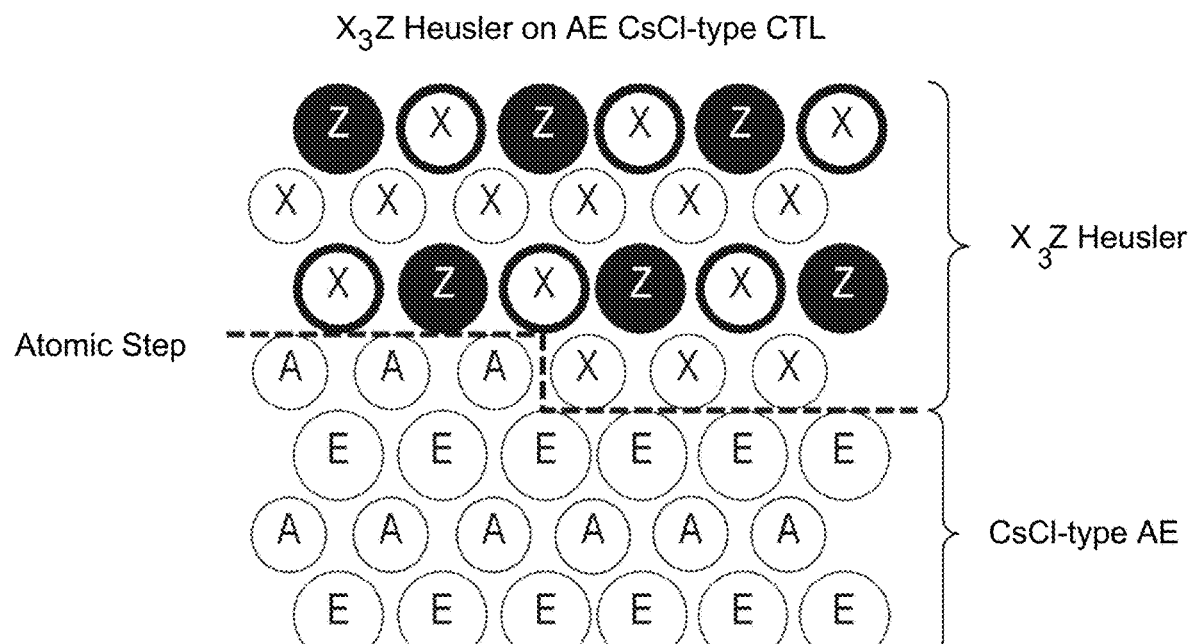
FIG. 1 illustrates an embodiment of the templating concept. A and X represent transition metal elements, and E and Z represent main group elements.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

New magnetic materials are needed to allow for scaling of magnetic devices such as spin transfer torque magnetic random access memories (STT MRAM beyond the 20 nm node. These materials are desired to have very large perpendicular magnetic anisotropy (PMA) and, for integration purposes, be compatible with conventional CMOS technologies. Such magnetic materials form electrodes of magnetic tunnel junction (MTJ) based memory elements. A mechanism for switching the state of the MTJ element is using spin polarized tunneling currents that are passed through the MTJ. The magnitude of this current is limited by the size of the transistors used to provide the write current. This means that the thickness of the electrode must be sufficiently small that it can be switched by the available current. For magnetization values of ~1000 emu/cm$^3$, the electrode should have a thickness that does not exceed approximately 1 nm. Recently it has been shown that using templating layers, such as CoAl, CoGa, CoSn, or CoGe, it is possible to deposit an ultrathin Heusler layer (thickness of ~1 nm) having bulk-like magnetic properties. These ultrathin Heusler compound films of even a single unit cell thickness showed perpendicular magnetic anisotropy and square magnetic hysteresis loops, making them candidate materials for use in STT-MRAM and racetrack memory applications.

Moreover, the ultrathin Heusler compound films deposited on templating layers, such as CoAl, CoGa, CoSn, or CoGe, grow epitaxially, i.e., the ultrathin Heusler compound has the same or substantially same in-plane lattice constant as that of the templating layer. There exists a significant lattice mismatch between these templating layers and the MgO tunnel barrier (>5%), which may result in low tunnel magnetoresistance (TMR), as a result of incoherent tunneling through the tunnel barrier. Such a reduction in TMR is undesirable for device performance.

As mentioned above, the ultrathin Heusler compound films with perpendicular magnetic anisotropy and square magnetic hysteresis loops may be used in STT-MRAM and racetrack memory applications. In such applications, a synthetic anti-ferromagnet (SAF) may be used. In an STT-MRAM application, the reference layer can include an SAF structure because this structure has very small fringing fields, which are the primary cause of the offset fields observed in the measured hysteresis loops of the storage layer. In a racetrack memory, the domain wall velocities in nanowires of an SAF structure are significantly higher than those in the nanowires of conventional ferromagnets. The SAF structures formed from conventional ferromagnets use Ru as the non-magnetic spacer layer. The family of tetragonal Heusler compounds, which include $Mn_3Z$ with Z=Ge, Sn, and Sb, have a layered structure of alternating layers of Mn—Mn and Mn—Z. The use of a known elemental spacer layer (e.g., Ru alone) does not work for structures that include two Heusler layers, since elemental Ru is unable to replicate the ordering of a Heusler layer underneath it; thus, it is unable to promote the ordering in a Heusler layer grown over the Ru spacer layer.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. One of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. One of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction. The method and system are also described in the context of certain alloys. Unless otherwise specified, if specific concentrations of the alloy are not mentioned, any stoichiometry not inconsistent with the method and system may be used.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

A device including a templating structure and a magnetic layer on the templating structure is described. The templating structure includes D and E. A ratio of D to E is represented by $D_{1-x}E_x$, with x being at least 0.4 and not more than 0.6. E includes a main constituent. The main constituent includes at least one of Al, Ga, and Ge. Further, E includes at least fifty atomic percent of the main constituent. D includes at least one constituent that includes Ir, D includes at least 50 atomic percent of the at least one constituent. The templating structure is nonmagnetic at room temperature. The magnetic layer includes at least one of a Heusler compound and an $L1_0$ compound, the magnetic layer being in contact with the templating structure. In some embodiments, the templating structure includes alternating layers of D and E. In some embodiments, x is at least 0.47 and not more than 0.54. In some such embodiments, the templating structure has a thickness of at least thirty Angstroms and not more than six hundred Angstroms such that the templating structure has a lattice constant (e.g. an in-plane lattice constant) of at least 2.8 Angstroms and not more than 3.05 Angstroms. In some embodiments, the templating structure has a thickness of not more than five hundred and fifty Angstroms. In some such embodiments, the thickness of the templating structure is not more than five hundred and ten Angstroms. In some embodiments, the templating structure has a thickness of not more than five hundred Angstroms. In some embodiments, the magnetic layer has a thickness of not more than five nanometers. The magnetic layer may be not more than three nanometers thick. In some such embodiments, wherein the magnetic layer has a thickness of not more than one unit cell. In some embodiments, the magnetic layer includes at least one of $Mn_{3.1-y}Ge$, $Mn_{3.1-y}Sn$, $Mn_{3.1-y}Sb$, $Mn_{3.1-s}Co_{1.1-t}Sn$, a MnGa alloy, a MnAl alloy, an FeAl alloy, a MnGe alloy, a MnSb alloy, and a MnSn alloy, with y being at least 0 and not more than 1.1, and with s being greater than zero and not more than 1.2 and t is greater than zero and not more than 1.0. The magnetic layer may be magnetic as-deposited and/or may be deposited at room temperature. In some embodiments, the device an additional magnetic layer and a tunneling barrier layer between the additional magnetic layer the magnetic layer.

A method for providing a device is also described. The method includes providing a templating structure and providing a magnetic layer on the templating structure. The templating structure includes D and E. The ratio of D to E is represented by $D_{1-x}E_x$, with x being at least 0.4 and not more than 0.6. In some embodiments, x is at least 0.47 and not more than 0.54. E includes a main constituent, which is at least one of Al, Ga, and Ge. E includes at least fifty atomic percent of the main constituent. D includes at least one constituent that includes Ir. D includes at least 50 atomic percent of the constituent(s). The templating structure may be nonmagnetic at room temperature. The magnetic layer includes at least one of a Heusler compound and an $L1_0$ compound and may be in contact with the templating structure.

In some embodiments, providing the templating structure includes depositing alternating layers of D and E. The templating structure may be annealed at an anneal temperature of at least two hundred degrees Celsius. In some embodiments, the anneal temperature is at least four hundred degrees Celsius. In some embodiments, a target lattice constant of the magnetic layer is selected. In such embodiments, providing the templating structure further includes depositing the templating structure to a thickness of at least thirty Angstroms and not more than six hundred Angstroms such that the templating structure has a lattice constant (e.g. an in-plane lattice constant) of at least 2.8 Angstroms and not more than 3.05 Angstroms. In some embodiments, the templating structure has a thickness of not more than five hundred and fifty Angstroms. In some such embodiments, the thickness of the templating structure is not more than five hundred and ten Angstroms. In some embodiments, the templating structure has a thickness of not more than five hundred Angstroms. The lattice constant may be chosen to correspond to the target lattice constant. The magnetic layer has a thickness of not more than five nanometers in some embodiments. For example, the magnetic layer may have a thickness of not more than one unit cell. In some embodiments, the magnetic layer includes at least one of $Mn_{3.1-y}Ge$, $Mn_{3.1-y}Sn$, $Mn_{3.1-y}Sb$, and $Mn_{3.1-s}Co_{1.1-t}Sn$ with y being at least 0 and not more than 1.1, and with s being greater than zero and not more than 1.2 and t is greater than zero and not more than 1.0. In some embodiments, the method further includes providing an additional magnetic layer and providing a tunneling barrier layer between the additional magnetic layer and the magnetic layer. In some embodiments, providing the magnetic layer further includes depositing the magnetic layer at room temperature.

IrAl templating layer(s) which promote growth of ultrathin Heusler compound films with perpendicular magnetic anisotropy and square magnetic hysteresis loops are described. Disclosed herein is a templating layer whose in-plane lattice constant can be pre-selected over a significant range that includes the lattice constant of the MgO tunnel barrier. Disclosed herein is a spacer layer that promotes the formation of an SAF structure between Heusler layers. It is shown herein that an IrAl alloy spacer layer having the CsCl structure induces anti-ferromagnetic coupling between two tetragonal Heusler compound layers separated by that spacer layer.

Disclosed herein are highly textured, very smooth, high quality ultrathin films of Heusler compounds, which can be fabricated without a thermal annealing process (or with a lower temperature thermal annealing process), using a nonmagnetic templating layer. The templating layer may be formed from a binary alloy of Ir—Al with the B2 structure, the cubic version of $L1_0$. The templating layer can be deposited at room temperature and is atomically ordered (i.e., alternating atomic layers of Ir and Al are formed), even in the as-deposited state. Ultrathin films of Heusler compounds deposited on these templating layers are highly epitaxial, atomically ordered, high quality films with excellent magnetic properties, including especially high values of perpendicular magnetic anisotropy and square magnetic hysteresis loops (with the remanent moment in zero magnetic field being close to the saturation moment). This is attributed to the similarity between the B2 symmetry of the templating layer and the $L2_1$ or $D0_{22}$ symmetry of the Heusler layer.

A characteristic of the underlayer (e.g. a templating layer) is that it is composed of elements that are similar to those of the Heusler compound. For example, any intermixing or diffusion of the Al from the IrAl underlayers into the Heusler layer does not significantly change the properties of the Heusler layer, since Al is from the class of Z elements from which the Heuslers are formed. Similarly, underlayers that partially replace Al with other Z elements, such as Ga, Ge and/or Sn, are suitable for the underlayers. The Ir within the IrAl underlayers can also diffuse into the Heusler without causing significant degradation of the magnetic properties of the Heusler layer. Thus, the underlayers are advantageously formed from A-E alloys, where A is a transition metal and E is a main group element.

Another property of the underlayer is that it can promote the desired ordering of the Heusler compound. The underlayer will generally have terraces with atomic steps between neighboring terraces, in which each of the steps separates a terrace with a surface formed from Ir from a terrace formed from Al. Due to the chemical affinity of X (or Y) to Al, and of Z to Ir, the underlayer promotes the desired ordering of the Heusler compound at modest temperatures even as low as room temperature, as illustrated in FIG. 1. Annealing does not significantly improve the magnetic properties of the Heusler compound.

Such Heusler compounds are used herein to form memory storage elements (e.g., racetrack and MRAM) and synthetic anti-ferromagnets, which are disclosed herein. Associated methods of formation, including a method of preselecting a desired lattice constant of a structure are also disclosed.

IrAl Templating Layer

Single crystal epitaxial films of $Ir_{1-x}Al_x$ alloy were grown by dc-magnetron sputtering onto MgO buffer layers overlying MgO(001) single crystal substrates, in an ultra-high vacuum (UHV) chamber with a base pressure of ~1×10$^{-9}$ Torr. The MgO substrates were cleaned in an ultrasonic bath of methanol for 30 min, treated in an isopropyl alcohol (IPA) vapor degreaser for 2 min, dried with $N_2$ gas at 65° C. for 15 min, and then transferred into the deposition chamber where they were annealed at 650° C. for 30 min in ultra-high vacuum (UHV). The MgO buffer layer was prepared by depositing 20 Å thick MgO at room temperature using rf-magnetron sputtering from a MgO target. For all the magnetron sputtering processes, Argon was the sputtering gas at a typical gas pressure of 3 mTorr. Films of 300 Å thick IrAl were deposited at room temperature. These films were either not annealed or annealed at various temperatures $T_{AN}$=200, 300, 400, and 500° C. for 30 minutes. The composition of the IrAl layers was determined to be $Ir_{51.6}Al_{48.4}$ by Rutherford backscattering (RBS) measurement. Elements other than those discussed herein may be present in the disclosed structures. For example, although pristine Ir and Al layers are frequently used, these layers may include other elements that constitute a significant atomic percentage of these layers (e.g., up to 50 atomic percent).

Figure 3:
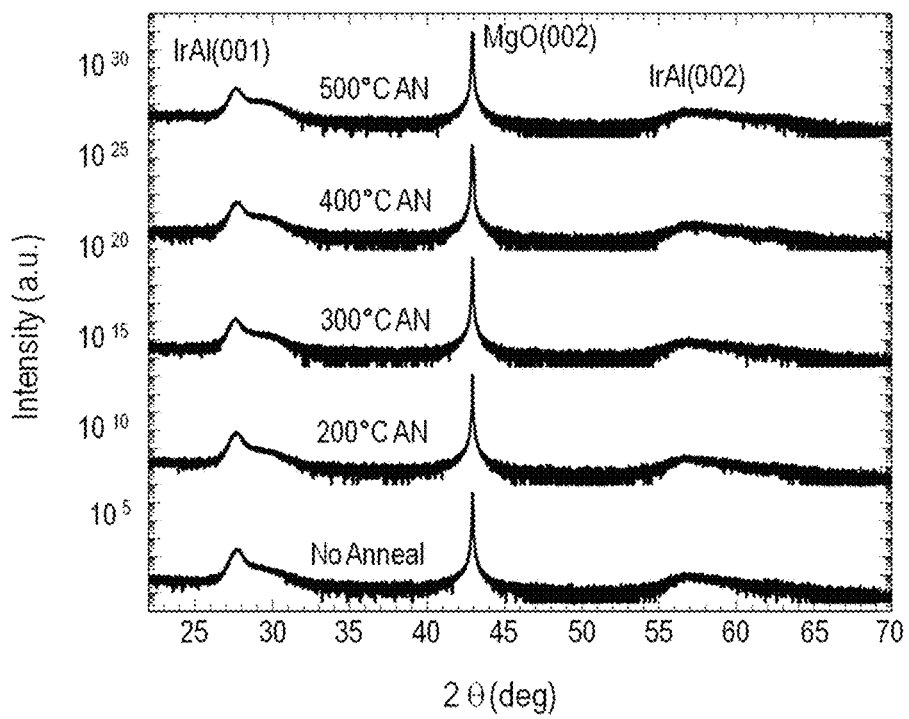
FIG. 3 shows XRD scans of 300 Å thick $Ir_{1-x}Al_x$ films on a MgO/MgO(001) substrate. IrAl films were deposited at room temperature and annealed in situ at various temperatures in vacuum.

X-ray diffraction (XRD) θ-2θ scans were performed on these films. These XRD measurements were performed using a Bruker D8 Discover system at room temperature. FIG. 3 shows XRD scans of IrAl films annealed at various temperatures $T_{AN}$ for 30 minutes. These IrAl films were deposited from a single IrAl alloy target. The data were compared with those taken from an IrAl film which was not annealed. The data show the main IrAl (002) peak at 2θ32 ~57° as well as the IrAl (001) peak at 2θ=~27.5°. The existence of the IrAl (001) superlattice peak clearly indicates that there is an alternate layering of Ir and Al even in the absence of annealing; even when annealing is employed, the alternate layering structure is preserved. The X-ray diffraction associated with the substrate was observed for all samples and is labeled as the MgO(002) peak.

Figure 4:
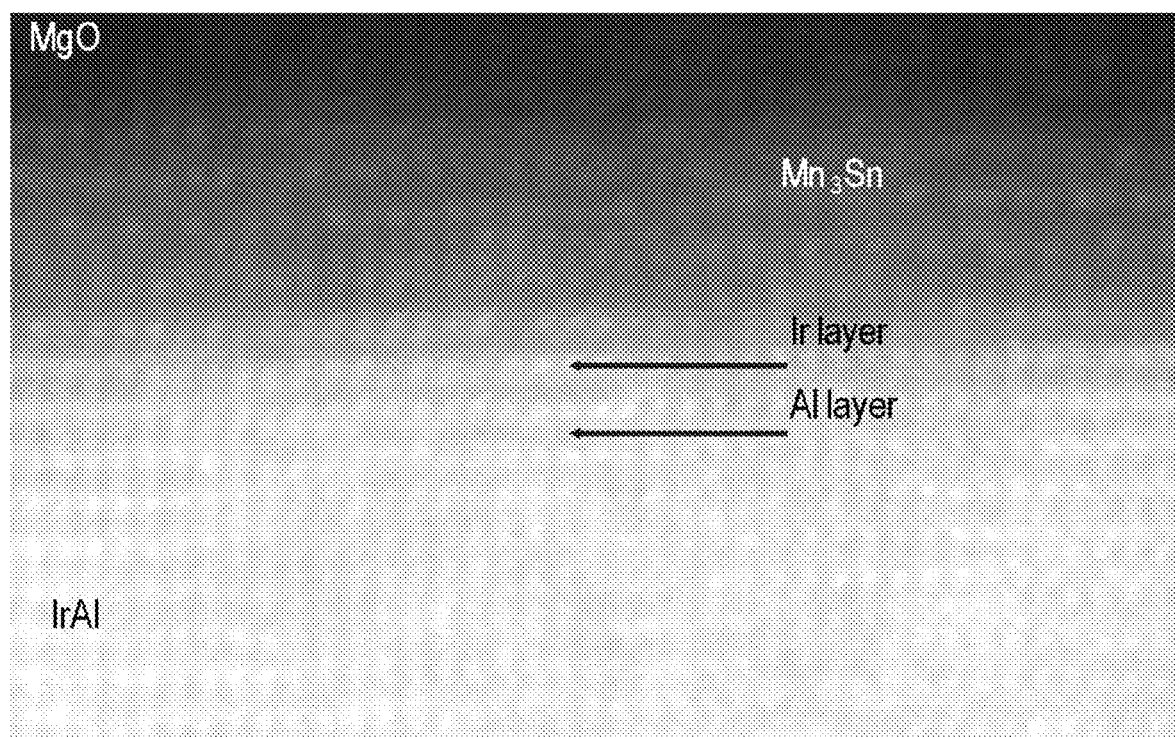
FIG. 4 shows a high resolution TEM image of 20 Å thick $Mn_3Sn$ film on an IrAl templating layer that was grown on a MgO(001) single crystal substrate (not shown).

FIG. 4 is a high resolution, scanning transmission electron microscopy (HR-STEM) image of a typical 20 Å $Mn_3Sn$ layer grown on an IrAl templating layer. The stack of this sample was MgO(001)/20 Å MgO/300 Å IrAl/20 Å $Mn_3Sn$/20 Å MgO/20 Å Ta. The IrAl templating layer consists of alternating layers of Ir and Al in agreement with the XRD measurements detailed in FIG. 3. The epitaxial matching of 20 Å thick $Mn_3Sn$ layers with the IrAl templating layer is clearly seen. Furthermore, the desired ordering within the Heusler layer is evident: The Mn—Sn layers are also distinguishable from the Mn—Mn layers, showing the alternating atomic layers and even the desired ordering within each Mn—Sn layer.

Figure 5:
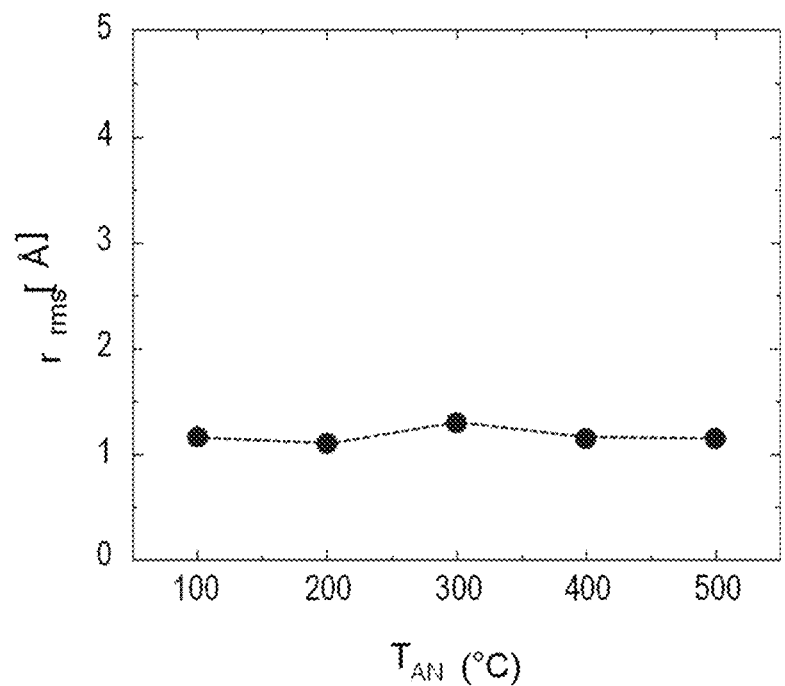
FIG. 5 shows root mean square (RMS) roughness ($r_{rms}$) versus annealing temperature of an IrAl templating layer.

Atomic force microscopy was performed to probe the surface morphology of 300 Å thick IrAl templating layers. FIG. 5 shows the root-mean-squared surface roughness ($r_{rms}$) for various annealing temperatures. The films show a very smooth surface independent of annealing temperature, with $r_{rms}$~1 Å.

$Mn_3Z$ Tetragonal Heusler

Figure 6:
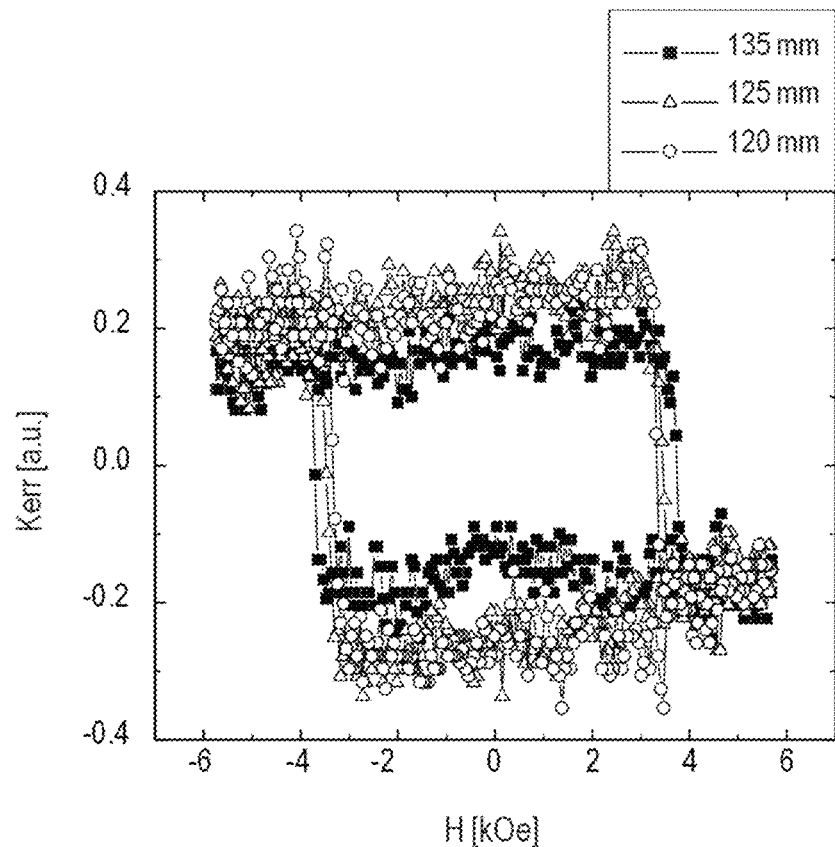
FIG. 6 presents room temperature perpendicular magneto-optical Kerr effect (P-MOKE) hysteresis loops of 20 Å thick $Mn_3Sn$ films on a 300 Å IrAl templating layer. The IrAl layer was deposited at various target-to-substrate distances with 135 mm being the typical value.
Figure 7:
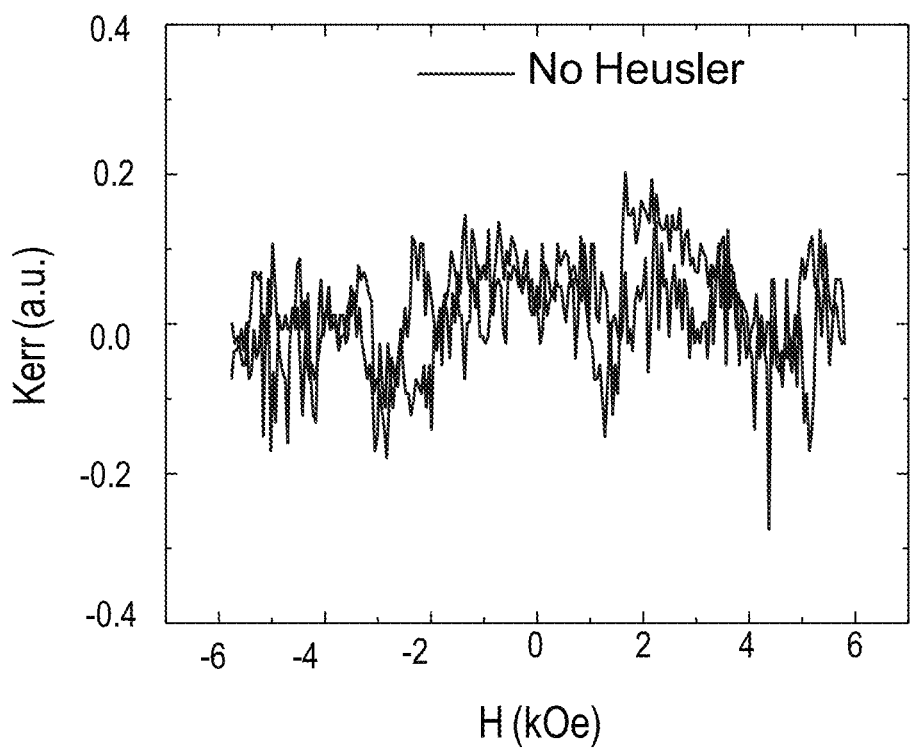
FIG. 7 shows a perpendicular MOKE hysteresis loop from an IrAl templating layer grown on a MgO(001) single crystalline substrate at room temperature.

20 Å-thick $Mn_3Sn$ films were deposited at room temperature by magnetron sputter deposition on an IrAl templating layer. The stacks were capped by 20 Å thick MgO and 20 Å thick Ta to prevent ambient oxidation of the Heusler layer. The resulting structures were of the form: MgO(001)/20 Å MgO/300 Å IrAl/20 Å $Mn_3Sn$/20 Å MgO/20 Å Ta. The IrAl layers were deposited at room temperature with various substrate-to-target distances. The typical substrate-to-target distance is ~135 mm in the deposition tool. Four deposition positions were evaluated: 135 mm, 125 mm, 120 mm, and 113 mm (i.e., the substrate was also placed closer to the target than the typical substrate-to-target distances of 135 mm, by 10, 15, and 22 mm, respectively). Table 1 (see end of specification) includes the RBS composition of the IrAl layer at these four deposition positions. As the substrate-to-target distance is decreased, the Ir content of the film is decreased. FIG. 6 shows the perpendicular magneto-optical Kerr effect (P-MOKE) hysteresis loops of $Mn_3Sn$ layer for deposition positions of 135 mm, 125 mm, and 120 mm. Interestingly, the magnetic properties of $Mn_3Sn$ are independent of these deposition positions, showing excellent PMA for all the films using an IrAl templating layer. Abrupt switching of the magnetic moment implies that there is no second phase. These results clearly demonstrate that an IrAl layer at compositions close to 1:1 promotes ordering within an ultrathin $Mn_3Sn$ Heusler compound, even when deposited at room temperature without any subsequent annealing, with the Heusler compound showing excellent PMA. FIG. 7 shows the P-MOKE signal from a MgO(001)/20 Å MgO/ 300 Å IrAl/20 Å MgO/20 Å Ta sample, which is the sample without the Heusler layer. The lack of any magnetic field-dependent MOKE signal clearly indicates that the IrAl templating layer is non-magnetic at room temperature. Though the data discussed above were collected with a structure that includes an IrAl templating layer and a $Mn_3Sn$ Heusler compound, the IrAl templating layer is equally effective in promoting desired ordering when used with $Mn_3Ge$, $Mn_3Sb$ and $Mn_3Ga$ Heusler compounds. The Heusler compounds can be $Mn_{3.1-x}Ge$, $Mn_{3.1-x}Sn$, $Mn_{3.1-x}Sb$, and $Mn_{3.1-x}Ga$, with x being in the range from 0 to 1.1. Alternatively, the Heusler compound used may be a ternary Heusler, such as $Mn_{3.1-x}Co_{1.1-y}Sn$, wherein x≤1.2 and y≤1.0. Furthermore, the IrAl templating layer is effective in inducing order within $L1_0$ compounds, whose constituent elements include one transition metal element and a main group element. Possible $L1_0$ compounds include MnAl alloys, MnGa alloys, MnSn alloys, MnGe alloys, MnSb alloys, and FeAl alloys.

The structural ordering of ultrathin layers is likely due to the differing chemical properties of the elements Ir and Al in the templating layer. As an alternative to Al, Al alloys such as AlSn, AlGe, AlGaGe, AlGaSn, AlGeSn, and AlGaGeSn may be employed. Furthermore, using an Ir—Co alloy instead of just Ir within the IrAl templating layer (with the Ir—Co alloy having the composition $Ir_xCo_{1-x}$, with x being in the range 0.0001 to 0.9999) will also promote structural ordering of ultrathin Heusler layers. Binary (X=Y) and ternary Heusler alloys consist of two or three different types of atoms, respectively. In $X_2YZ$ Heuslers, the Z main group element typically has a high chemical affinity for X and Y. In this context, the formation of an ordered structure should take place, irrespective of the choice of Z.

The structure described above can be used in racetrack memory devices. For example, the racetrack may be a nanowire that may include a substrate, an optional seed layer, a templating layer, and a first magnetic layer of a Heusler compound (see FIG. 8). (The electrode on the left side of the structure is part of the electrical circuit used to pass flow current through the device—see also FIGS. 9, 14-18, and 22-24. The electrodes called out in the various stacks herein represent magnetic layers.) Magnetic domain walls may be moved along this racetrack, as described in U.S. Pat. No. 6,834,005. Data may be read out of (and stored in) the racetrack by interrogating (or changing) the orientation of the magnetic moment of the magnetic material between adjacent domain walls within the racetrack.

Figure 8:
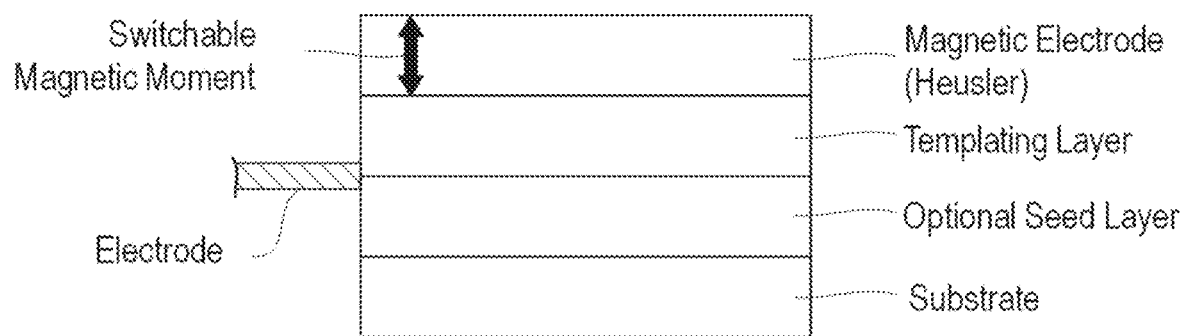
FIG. 8 illustrates part of a device that incorporates the templating and Heusler layers described herein.

FIG. 8 illustrates a device that includes an optional seed layer overlying a substrate. The top two layers form a device that includes a magnetic (e.g. Heusler) layer that overlies a templating layer (multi-layered structure) of the sort described herein. This multi-layered structure is non-magnetic at room temperature and includes alternating layers of D and E, which are now defined. (The multi-layered structure of FIG. 8 is shown in greater detail in FIG. 1, where D is represented by the letter A.) E comprises at least one of (e.g. one, two or more of) Al, Ga, and Ge, with the composition of the structure being represented by $D_{1-x}E_x$, in which x is in the range from 0.47 to 0.54 in some embodiments (e.g. at least 0.4 and not more than 0.6 in some embodiments), and with this main group element representing at least 50 atomic percent of E. On the other hand, D comprises at least one element that includes Ir, with Ir representing at least 50 atomic percent of D. (D may optionally include up to at least 10 percent or more of Co.) The magnetic layer may advantageously be a pure Heusler compound; alternatively, it may include a Heusler and/or an $L1_0$ compound (e.g., a compound selected from the group consisting of MnGa, MnAl, FeAl, MnGe, MnSb, and MnSn alloys). This magnetic layer (which may be less than 5 nm thick; data obtained with a thickness of just one unit cell show satisfactory magnetism) may contact and overlie the multi-layered structure, as shown in FIG. 8. Other thicknesses and compositions are possible.

In some embodiments, the Heusler compound of FIG. 8 may be selected from the group consisting of $Mn_{3.1-x}Ge$, $Mn_{3.1-x}Sn$, and $Mn_{3.1-x}Sb$, with x being in the range from 0 to not more than 1.1. Alternatively, the Heusler compound may be a ternary Heusler, e.g., $Mn_{3.1-x}Co_{1.1-y}Sn$, in which $x \leq 1.2$ and $y \leq 1.0$. The Heusler may also advantageously include Co.

Standard deposition techniques may be used to form the devices of FIG. 8 and FIG. 9 (discussed below). By way of example, Ir and Al may be deposited onto a substrate, thereby forming a composite layer on it. The composite layer may then be annealed (at a temperature of at least 200° C. and at least 400° C. in some embodiments), so that at least one layer of Ir and at least one layer of Al are formed from the composite layer, resulting in the formation of the multi-layered structure. Additional layers, such as a magnetic (Heusler) layer may be formed over the multi-layered structure (e.g., via deposition).

Figure 9:
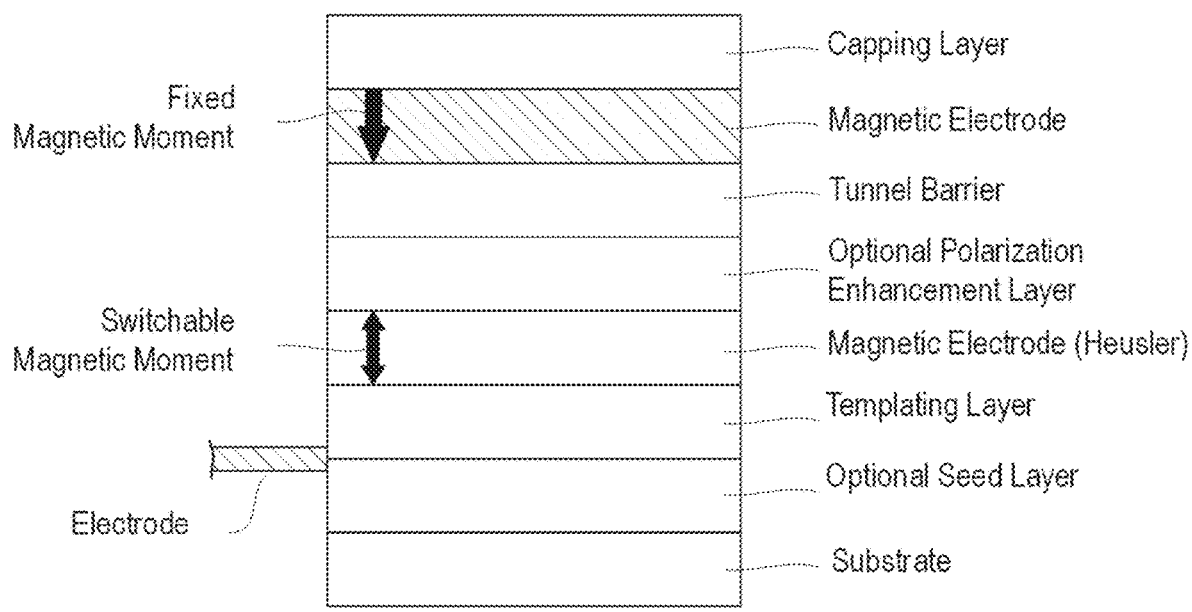
FIG. 9 illustrates an embodiment of a magnetic tunnel junction device that incorporates the templating and Heusler layers described herein.

The structure described above in connection with FIG. 8 can also be used as part of an MRAM memory device, and one such MRAM memory element is shown in FIG. 9. As with MRAM elements generally, a tunnel barrier is situated between two magnetic electrodes, one of which has a fixed magnetic moment and the other of which has a magnetic moment that is switchable, thereby permitting the recording and erasing of data. The Heusler layer, which may be either ferro- or ferri-magnetic, overlies a templating layer which in turn overlies a substrate; the Heusler layer has its magnetic moment aligned perpendicular to the layer plane. An optional seed layer may be interposed between the substrate and the templating layer. An optional polarization enhancement layer may be used to increase performance and may include Fe, a CoFe alloy, and/or $Co_2MnSi$. The tunnel barrier may be MgO (001), although other (001)-oriented tunnel barriers may be used, such as CaO and LiF. In some embodiments, $MgAl_2O_4$ can be used as a tunnel barrier, with its lattice spacing being selected by controlling the Mg—Al composition, thereby resulting in better lattice matching with the Heusler compounds (e.g., the composition of this tunnel barrier can be represented as $Mg_{1-z}Al_{2+(2/3)z}O_4$, wherein $-0.5 < z < 0.5$). The magnetic electrode overlying the tunnel barrier may comprise Fe, a CoFe alloy, or a CoFeB alloy, for example. If the magnetic layer on top of the barrier has a fixed magnetic moment, then its moment can be stabilized by placing a synthetic antiferromagnet (SAF) in proximity with it (e.g., above it, as shown). The capping layer may comprise Mo, W, Ta, Ru, or a combination thereof. Current may be induced by applying a voltage between the two magnetic electrodes, which are separated by the tunnel barrier.

IrAl Templating Layer with Tunable Lattice Constant

Figure 10:
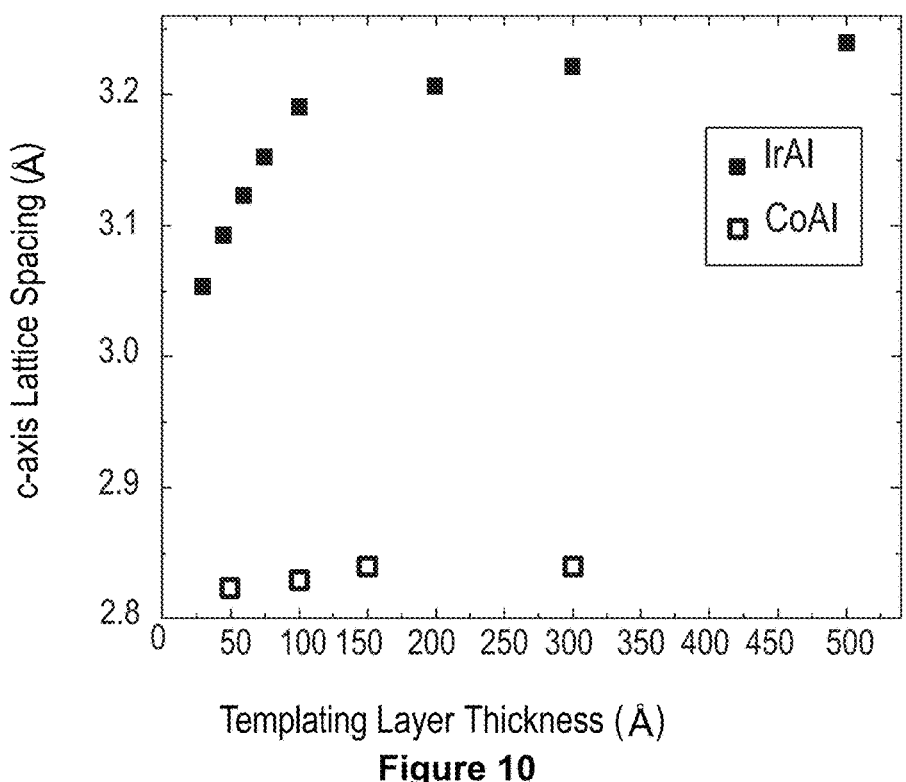
FIG. 10 shows the c-axis lattice spacing as a function of IrAl and CoAl templating layer thicknesses.
Figure 11:
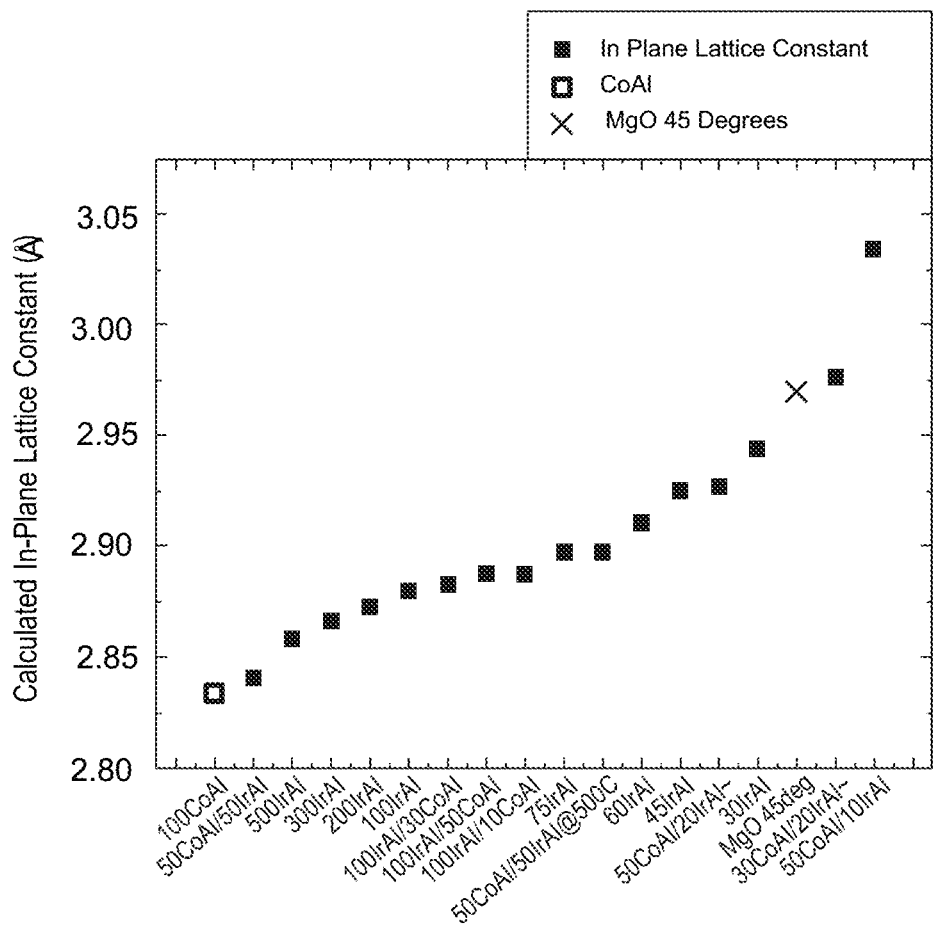
FIG. 11 indicates the in-plane lattice constant for different thicknesses of embodiments of IrAl and CoAl/IrAl bilayers.

FIG. 10 shows the out-of-plane c-axis lattice spacing of the Ir—Al and Co—Al templating layers. The resulting structures are of the form MgO(001)/20 Å MgO/x Å IrAl/20 Å MgO/20 Å Ta where x=30, 45, 60, 75, 100, 200, 300 and 500 Å and MgO(001)/20 Å MgO/y Å CoAl/20 Å MgO/20 Å Ta, where y=50, 100, 150, and 300 Å. The c-axis lattice spacing was determined by X-ray diffraction (XRD) θ-2θ scans. For the embodiments shown, the c-axis lattice spacing for the CoAl templating layer is independent of the CoAl thickness studied here, whereas the c-axis lattice spacing for the IrAl templating layer varies systematically from 3.05 to 3.25 Å, as a function of the IrAl layer thickness. This variation can be extended even further by using a bilayer of CoAl/IrAl. Assuming the validity of the Poisson effect (i.e., unit cell volume is conserved) and using the known value for the volume of the IrAl unit cell, the in-plane lattice constant for IrAl templating layers can be estimated. FIG. 11 is a plot of the calculated in-plane lattice constant for various thicknesses of IrAl in a single IrAl layer or within an IrAl/CoAl bilayer. (Note that the possibly limiting cases of CoAl only and MgO are also included for comparison.) In some embodiments, the in-plane lattice constant can be selected in advance to be anywhere from ~2.83 to ~3.05 Å (e.g. at least 2.8 Angstroms and not more than 3.1 Angstroms in some embodiments). This range includes (overlaps with) the lattice match to the MgO tunnel barrier.

$Mn_3Z$ Heusler Compound

Figure 12:
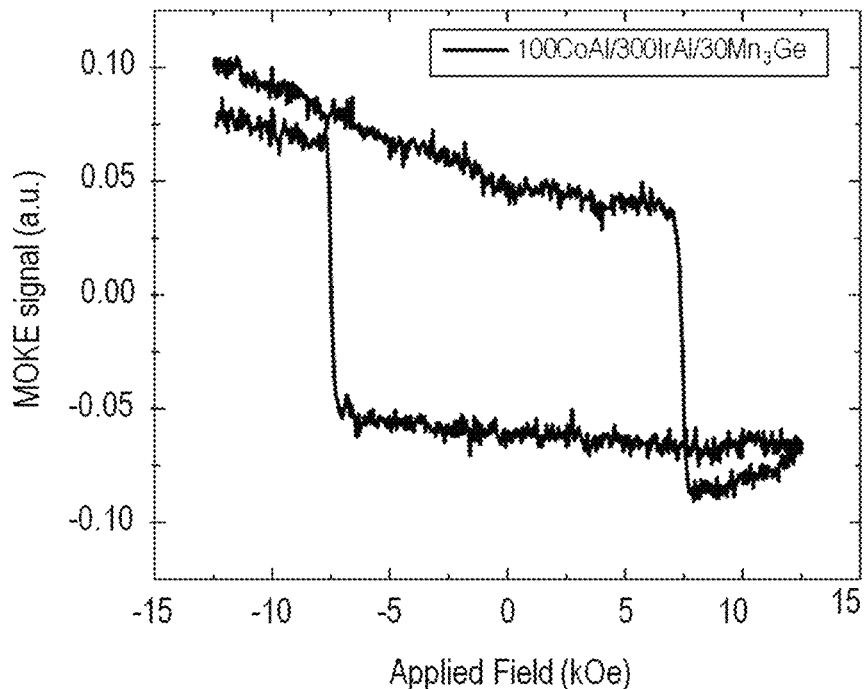
FIG. 12 shows P-MOKE hysteresis loops of a 30 Å thick $Mn_3Ge$ Heusler layer on a CoAl/IrAl templating bilayer that was grown on a MgO(001) single crystalline substrate.

An IrAl templating layer is disclosed that is capable of inducing order in ultra-thin $Mn_3Z$ (e.g. $Mn_3Ge$, $Mn_3Sn$, and $Mn_3Sb$) Heusler films including when deposited at room temperature. The stack discussed herein consists of MgO (001)/20 Å MgO/100 Å CoAl/300 Å IrAl/30 Å $Mn_3Ge$/20 Å MgO/20 Å Ta. Thus, $Mn_3Ge$ is discussed. FIG. 12 shows the P-MOKE hysteresis loops obtained for this structure. A square hysteresis loop indicates substantial remanent magnetization at zero applied field. This result demonstrates that the IrAl templating layer can induce order in an ultrathin $Mn_3Ge$ layer even after deposition of the Heusler compound at room temperature. Likewise, an IrAl templating layer is effective in promoting order within $Mn_3Sb$ and $Mn_3Ga$ Heusler compounds. The binary Heusler compounds may advantageously have a composition given by $Mn_{3.1-x}Ge$, $Mn_{3.1-x}Sn$, $Mn_{3.1-x}Sb$, and $Mn_{3.1-x}Ga$, with x being in the range from 0 to not more than 1.1. Alternatively, the Heusler compound may be a ternary Heusler, such as $Mn_{3.1-x}Co_{1.1-y}Sn$, wherein x≤1.2 and y≤1.0. As for the CoAl templating layer, an IrAl templating layer may be effective in inducing order within $L1_0$ compounds, whose constituent elements include one transition metal element and a main group element. Possible $L1_0$ compounds include MnAl alloys, MnGa alloys, MnSn alloys, MnGe alloys, MnSb alloys, and FeAl alloys.

Figure 13:
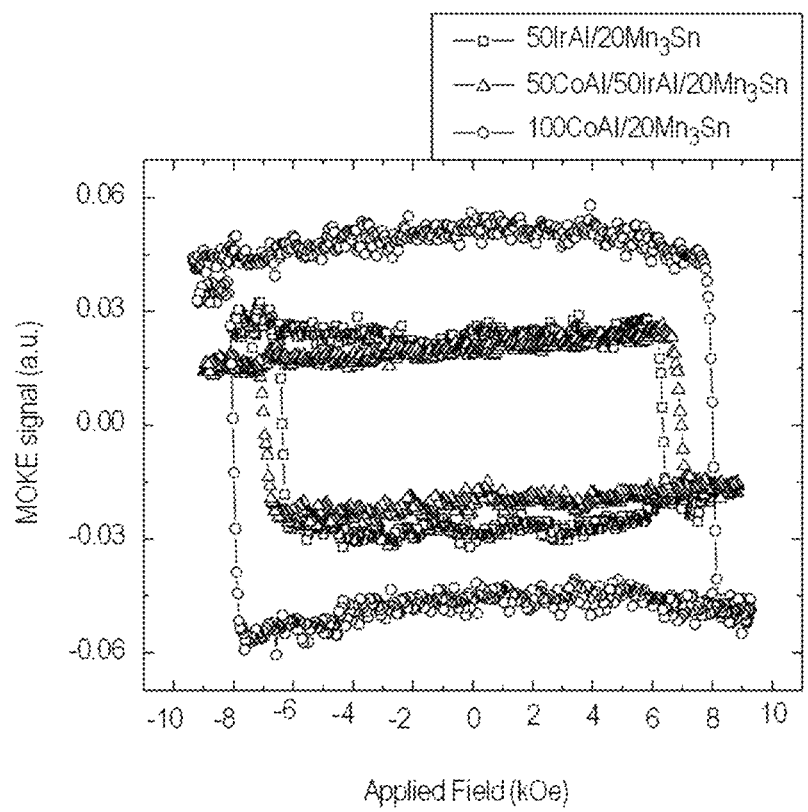
FIG. 13 shows P-MOKE hysteresis loops of a 20 Å thick $Mn_3Sn$ Heusler layer on the templating layers IrAl, CoAl/IrAl, and CoAl, grown on a MgO(001) single crystalline substrate.

FIG. 13 includes P-MOKE square hysteresis loops for 20 Å $Mn_3Sn$ Heusler layers deposited on IrAl, CoAl/IrAl, and CoAl templating layers. This illustrates that the embodiment of $Mn_3Sn$ Heusler layer is PMA even when its in-plane lattice constant is varied from ~2.84 to 2.92 Å (e.g. 2.8 Angstroms to 2.95 Angstroms in some embodiments).

Figure 14:
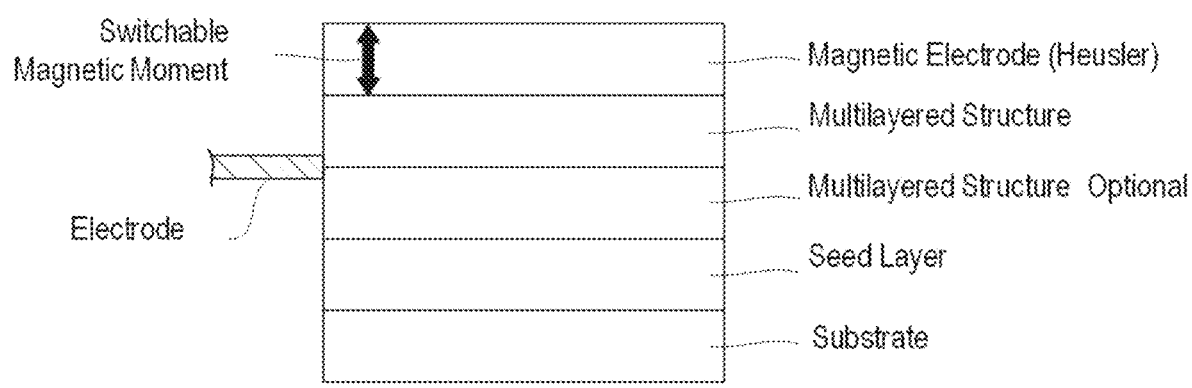
FIG. 14 illustrates layers formed when employing one method herein (including two different multilayered structures), in which a target in-plane lattice constant is selected prior to the deposition of the layers.
Figure 15:
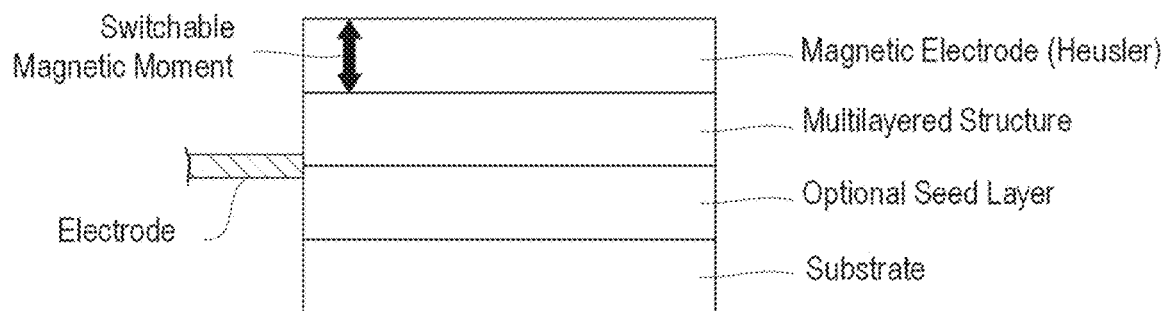
FIG. 15 illustrates part of a device that incorporates multilayered and Heusler layers described herein.

Based on the results described above, a target in-plane lattice constant can be achieved with either of the configurations of the templating structure shown in FIGS. 14 and 15. A first configuration of the templating structure (see FIG. 14) may include Ir and Co-containing multilayered structures in contact with each other, in either order. The thicknesses of the Ir and Co-containing multilayered structures are chosen to achieve the target in-plane lattice constant. A second configuration of the templating structure (see FIG. 15) may employ various thicknesses of the Ir-containing multilayered structure or a Co-containing multilayered structure.

Thus, the technology described herein lends itself to a method of forming a device whose associated lattice constant can be engineered. For example, for a device that includes at least one multi-layered structure and a first magnetic layer (e.g. a Heusler and/or an $L1_0$ compound, having at thickness of less than 5 nm) grown over (e.g., in contact with) the multi-layered structure, such a method includes selecting a target lattice constant for the first magnetic layer. If the first magnetic layer is a Heusler compound, it may be selected from the group consisting of $Mn_{3.1-x}Ge$, $Mn_{3.1-x}Sn$, and $Mn_{3.1-x}Sb$, with x being in the range from at least 0 to not more than 1.1. The magnetic layer may be also be advantageously doped with Co. Alternatively, the Heusler compound may be a ternary Heusler of the form $Mn_{3.1-x}Co_{1.1-y}Sn$, wherein x≤1.2 and y≤1.0. If the first magnetic layer is an $L1_0$ compound, it may be selected from the group consisting of MnGa, MnAl, FeAl, MnGe, MnSb, and MnSn alloys.

A multi-layered Ir-containing structure (that is non-magnetic at room temperature) is grown, in which the Ir-containing structure has a lattice constant and comprises alternating layers of Ir with E. The composition of the Ir-containing structure is represented by $Ir_{1-x}E_x$, wherein E comprises at least one other element that includes Al, with x being in the range from 0.4 to not more than 0.6 (e.g. at least 0.47 to not more than 0.54). The Ir-containing structure is grown such that its lattice constant matches the target lattice constant, by choosing the number of Ir layers and the number of Al layers in the Ir-containing structure, so that the desired thickness of the Ir-containing structure is obtained. In some embodiments, "matching" includes other than exact matches. For example, "matching" may include the Ir-containing structure's lattice constant being within five percent of the target lattice constant. In some embodiments, "matching" includes the Ir-containing structure's lattice constant being not more than three percent different from the target lattice constant. In some such embodiments, "matching" includes the Ir-containing structure's lattice constant being not more than one percent different from the target lattice constant. As indicated in FIG. 11, this thickness (for a given structure) determines the associated lattice constant. A magnetic layer is grown over the Ir-containing structure (either in contact with it, or in proximity with it as when an additional multi-layered structure is incorporated into the stack). In some embodiments, the thickness of the structure is at least twenty Angstroms and not more than six hundred Angstroms. In some such embodiments, thickness may be at least thirty Angstroms. In some embodiments, the templating structure has a thickness of not more than five hundred and fifty Angstroms. In some such embodiments, the thickness of the templating structure is not more than five hundred and ten Angstroms. In some embodiments, the templating structure has a thickness of not more than five hundred Angstroms.

In some embodiments, prior to growing the Ir-containing structure, a multi-layered Co-containing structure is grown that is non-magnetic at room temperature, with the Co-containing structure having a lattice constant and including alternating layers of Co with E'. The composition of the Co-containing structure is represented by $C_{1-y}E'_y$, in which E' comprises at least one other element that includes Al, with y being in the range of 0.4 to not more than 0.6 (e.g. at least 0.47 to not more than 0.54). In some embodiments, E and/or E' may be an AlGe alloy. Similarly, in some embodiments, E and/or E' may be an AlGa alloy.

The Co-containing structure is grown by choosing the number of Co layers and the number of Al layers in the Co-containing structure, so that the desired thickness of the Co-containing structure is obtained for the target lattice constant (e.g. as indicated in FIG. 11). In some embodiments, the Co-containing structure is in contact with the Ir-containing structure. For example, the Ir-containing structure may overlie the Co-containing structure or the Co-containing structure may be sandwiched between the Ir-containing structure and the first magnetic layer. In some embodiments, the Ir-containing structure and the Co-containing structure together form a templating structure having a thickness in the range of at least ten Angstroms to not more than six hundred Angstroms (e.g. at least 20 to not more than 500 Å in some cases), with an in-plane lattice constant in the range of 2.7 Angstroms to not more than 3.1 Angstroms (e.g. at least 2.82 Å to not more than 3.03 Å). This templating structure may be advantageously annealed prior to depositing the first magnetic layer. In some embodiments, the anneal temperature is at least 200° C.

Figure 17:
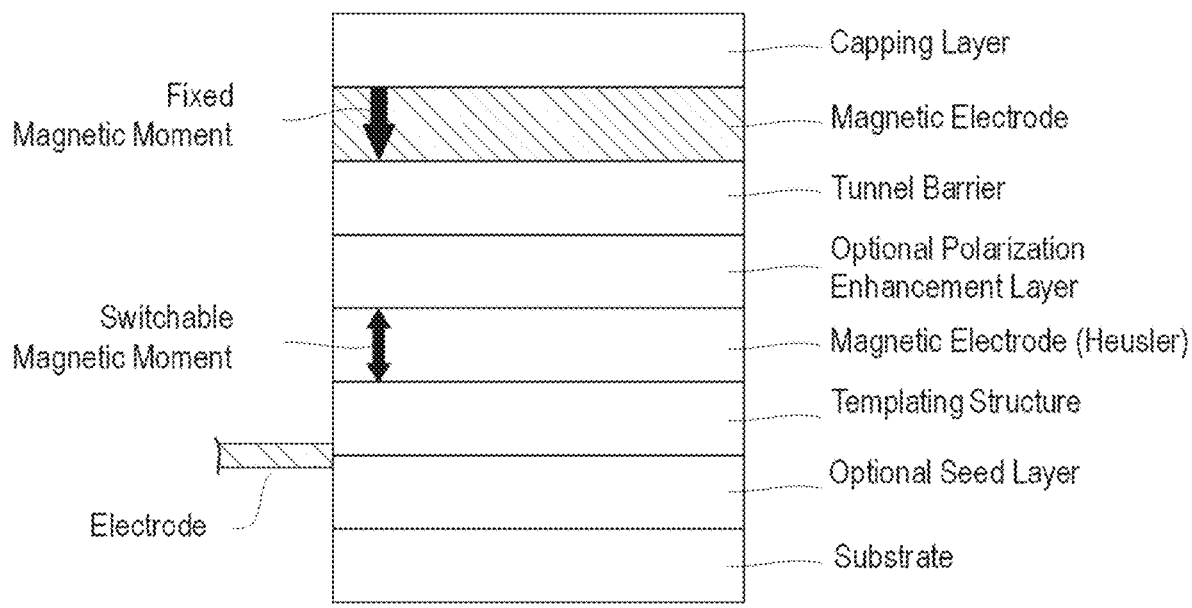
FIG. 17 illustrates an embodiment of a magnetic tunnel junction device that incorporates a templating structure and a Heusler layer, as described herein.
Figure 18:
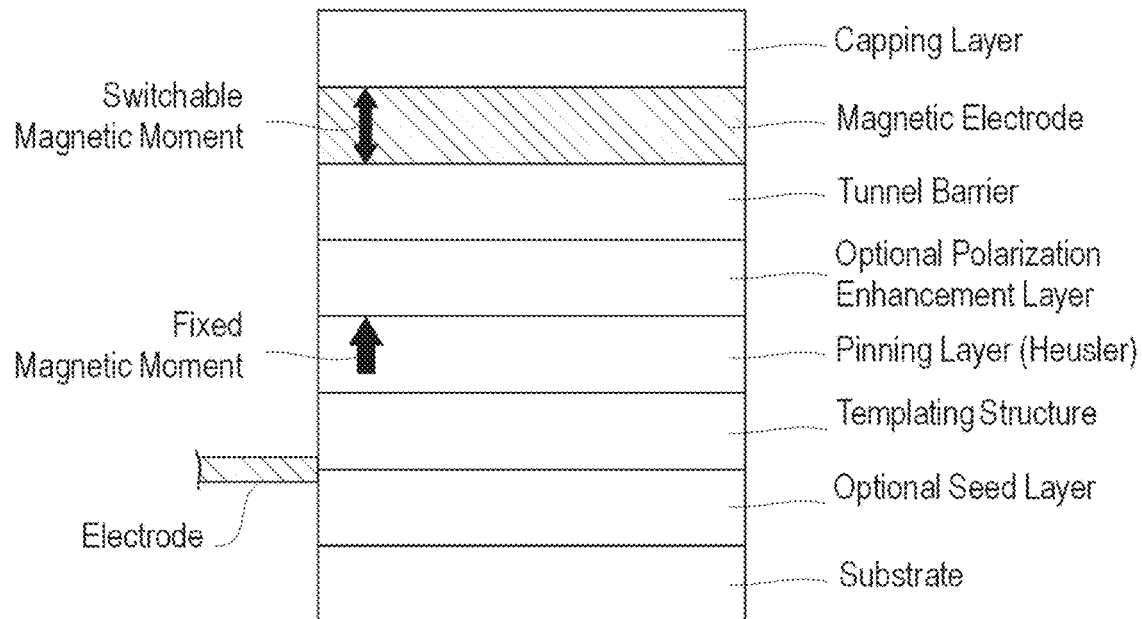
FIG. 18 illustrates an embodiment of a magnetic tunnel junction device that incorporates a templating structure and a Heusler layer that acts as a pinning layer.

In the event that the structure is extended to include a tunnel barrier (see below in connection with FIGS. 17 and 18), the method includes forming a tunnel barrier over the first magnetic layer. In operation, current may passes through both the tunnel barrier and the first magnetic layer. An optional polarization enhancement layer between the first magnetic layer and the tunnel barrier may also be included. A second magnetic layer above (e.g., in contact with) the tunnel barrier may also be included. The tunnel barrier may be MgO or $Mg_{1-z}Al_{2+(2/3)z}O_4$, wherein $-0.5<z<0.5$. As shown in the embodiments of FIGS. 17 and 18, a capping layer may be deposited over (e.g., in contact with) the second magnetic layer. In one aspect of the method, the structure may be formed so that current can pass through the tunnel barrier and both magnetic layers.

Figure 16:
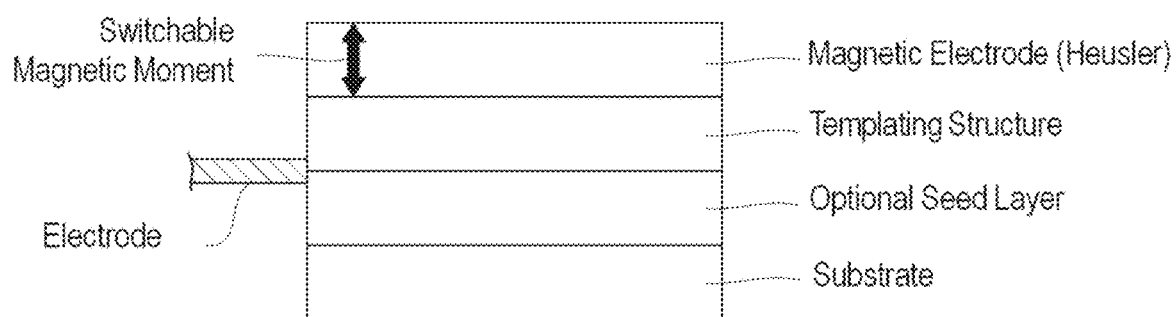
FIG. 16 illustrates an embodiment of a device that incorporates a templating structure and a Heusler layer, which can be used as a memory element in a racetrack device.

A structure including or consisting of a templating structure with a Heusler layer placed on a substrate with an optional seed layer can be used to fabricate racetrack memory devices. An embodiment of such a structure is depicted in FIG. 16. Magnetic domain walls may be moved along such a racetrack. Data may be read out of (and stored in) the racetrack by interrogating (or changing) the orientation of the magnetic moment of the magnetic material between adjacent domain walls within the racetrack.

The structure described above with respect to FIG. 16 can also be used as part of a MRAM memory device. Two possible configurations are shown in FIGS. 17 and 18, in which the switchable layers are different, with the Heusler layer described herein being switchable in FIG. 17 but not in FIG. 18. As with MRAM elements generally, a tunnel barrier is situated between two magnetic electrodes, one of which has a fixed magnetic moment and the other of which has a magnetic moment that is switchable, thereby permitting the recording and erasing of data. In some embodiments, the Heusler layer, which may be either ferro- or ferri-magnetic, overlies a templating layer which in turn overlies a substrate; the Heusler layer has its magnetic moment aligned perpendicular to the layer plane. An optional seed layer may be interposed between the substrate and the templating layer. An optional polarization enhancement layer may be used to increase performance and may include Fe, a CoFe alloy, and/or $Co_2MnSi$. The tunnel barrier may be MgO (001), although other (001)-oriented tunnel barriers may be used, such as CaO and LiF. In some embodiments, $MgAl_2O_4$ can be used as a tunnel barrier whose lattice spacing can be tuned (engineered) by controlling the Mg—Al composition to result in better lattice matching with the Heusler compounds (e.g., the composition of this tunnel barrier can be represented as $Mg_{1-z}Al_{2+(2/3)z}O_4$, wherein $-0.5<z<0.5$). The magnetic electrode overlying the tunnel barrier may comprise Fe, a CoFe alloy, and/or a CoFeB alloy, for example. If the magnetic layer on top of the barrier has a fixed magnetic moment, its moment can be stabilized by placing a synthetic antiferromagnet (SAF) in proximity with it. The capping layer may comprise Mo, W, Ta, Ru, or a combination thereof. Current may be induced by applying a voltage between the two magnetic electrodes, which are separated by the tunnel barrier.

IrAl Templating Layer as a SAF Spacer Layer

Figure 2:
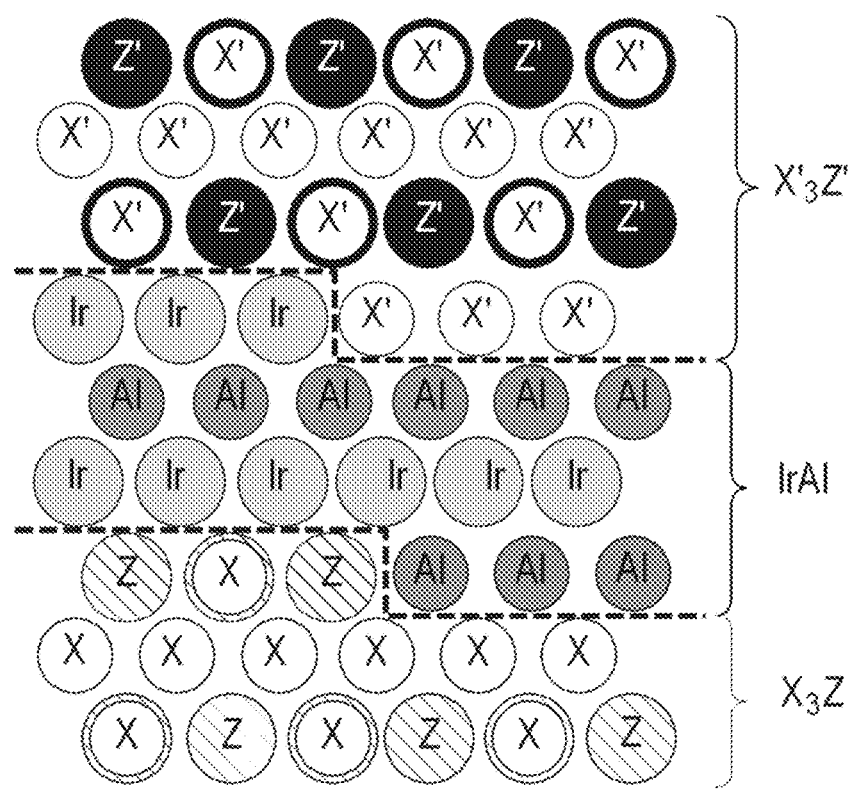
FIG. 2 illustrates an embodiment of the synthetic antiferromagnetic (SAF) structure with a Heusler bilayer separated by an IrAl spacer layer. X and X' represent transition metal elements, and Z and Z' represent main group elements.

FIG. 2 shows that the use of an IrAl spacer layer between layers of Heusler compounds can promote the formation of an SAF structure. The IrAl alloy spacer layer forms a structure of the CsCl structure type (Ir and Al form alternating layers) on top of the bottom Heusler layer ($X_3Z$ in FIG. 2). This IrAl alloy spacer layer templates the top Heusler layer ($X'_3Z'$ in FIG. 2) and promotes anti-ferromagnetic coupling between two tetragonal Heusler layers. IrGa, an alloy which also has the CsCl structure, is expected to induce similar Heusler SAF structures, in view of theoretical predictions. Moreover, substituting Ir—Ru for Ir within IrAl ($Ir_xRu_{1-x}$ with x in the range 0.0001 to 0.9999) will also induce anti-ferromagnetic coupling between two tetragonal Heusler compound layers. Likewise, IrGe would be expected to work as a templating layer for the top Heusler layer. Alternatively, an alloy of two or more of Al, Ga, and Ge could be used in combination with Ir or Ir—Ru.

Figure 19:
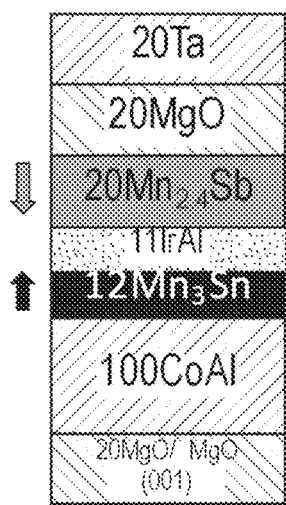
FIG. 19 shows a P-MOKE hysteresis loop from the illustrated Heusler stack, which includes an 11 Å IrAl spacer layer. The magnetic moments of the two Heusler-containing layers at different positions in the hysteresis loop are indicated with thick arrows, whereas the thin arrows indicate the scan direction. (The illustrated Heusler stack on the left-hand side shows magnetic moments corresponding to the case near zero field—compare with the loop shown on the right-hand side.)
Figure 19:
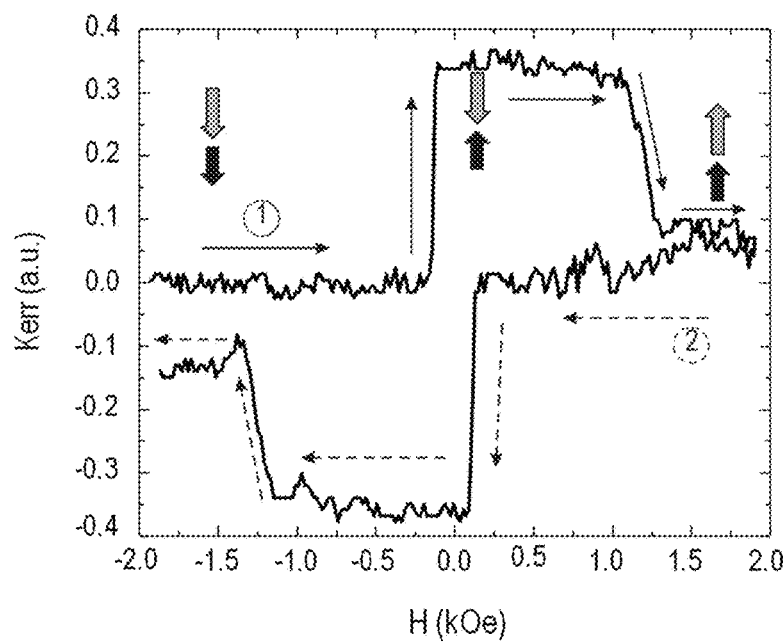

FIG. 19 includes a P-MOKE hysteresis loop obtained from a sample with two different layers of Heusler compounds separated by a non-magnetic spacer layer of IrAl. The stack of this sample was MgO(001)/20 Å MgO/100 Å CoAl/12 Å $Mn_3Sn$/t=11Å IrAl/20 Å $Mn_{2.4}Sb$/20 Å MgO/20 Å Ta (where "t" represents thickness). Three distinct hysteresis loops are observed, and the sets of pairs of arrows overlaid in FIG. 19 indicate the orientations of the magnetization of the $Mn_3Sn$ and $Mn_{2.4}Sb$ layers. At high applied fields (e.g. greater than 1.5 kOe), the magnetizations of the two Heusler compounds are parallel to each other and align with the externally applied field. At zero applied field, in the remanent state, the magnetizations of the two Heusler compounds are anti-parallel to each other. Thus, the presence of the 11Å IrAl spacer layer separating the two Heusler compounds promotes the formation of a synthetic anti-ferromagnet (SAF). Moreover, the Heusler compounds, along with their corresponding spacer layer, were deposited at room temperature, with the resulting SAF structure needing no subsequent annealing. Furthermore, in the case of two layers of Heusler compounds having magnetic moments that are in-plane, the presence of an 11Å IrAl spacer layer separating these two Heusler layers also leads to the formation of a synthetic anti-ferromagnet (SAF). More explicitly, here the magnetic moments of the Heusler layers are substantially parallel to the interfaces between the Heusler layers and the IrAl spacer layer separating them. In some embodiments, the magnetic moments of the two Heusler layers may be substantially anti-parallel to each other when the IrAl spacer layer has a thickness in the range of at least 3 to not more than 11 Å. In some embodiments, the IrAl spacer has a thickness of at least eight and not more than ten Angstroms. Moreover, the spacer layer providing anti-ferromagnetic coupling between the two Heusler compounds can be of the form D'Al (where D' represents Ir or an IrRu alloy) or IrE' (where E' is selected from the group consisting of Al, Ga, and Ge, and combinations thereof) or D'E' (where, for example, D' is an IrRu alloy and E' is an AlGa alloy).

Although the thickness of each of the Heusler layers within the SAF structure used herein was 1-2 nm, it is possible to form SAF structures with other thicknesses (e.g. significantly thicker) of Heusler layers. The Heusler layers within the bilayer may have thicknesses of less than 5 nm, or even less than 3 nm, or as little as the thickness of a single unit cell (e.g., 0.7-0.8 nm). Though formation of the SAF is demonstrated herein for two Heusler compounds, in general the Heusler compounds can be selected from the group including or consisting of $Mn_{3.1-x}Ge$, $Mn_{3.1-x}Sn$, and $Mn_{3.1-x}Sb$, with x being in the range from 0 to 1.1. Alternatively, the Heusler compounds may be a ternary Heusler, such as $Mn_{3.1-x}Co_{1.1-y}Sn$, wherein $x \leq 1.2$ and $y \leq 1.0$. The Heusler SAF structure can comprise a ternary Heusler compound as either the first Heusler layer, the second Heusler layer, or both Heusler layers.

$Mn_{2.3-2.4}Sb$ may be considered a Heusler or as part of the family of $L1_0$ compounds. Hence the results discussed above indicate that the IrAl templating spacer layer would also be effective in inducing SAF ordering between two $L1_0$ compounds (whose constituent elements include one transition metal element and a main group element). Possible $L1_0$ compounds include MnAl alloys, MnGa alloys, MnSn alloys, MnGe alloys, and FeAl alloys.

Figure 20:
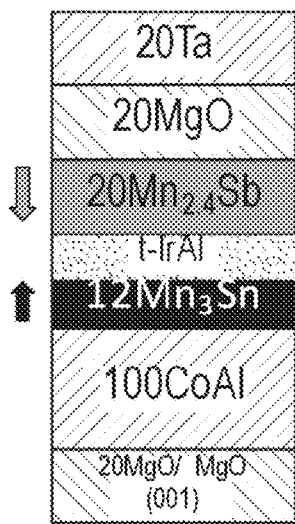
FIG. 20 shows P-MOKE hysteresis loops of embodiments of Heusler stacks (e.g. left hand side of FIG. 20) having different IrAl spacer layers of thicknesses 7, 9, and 11 Å.
Figure 20:
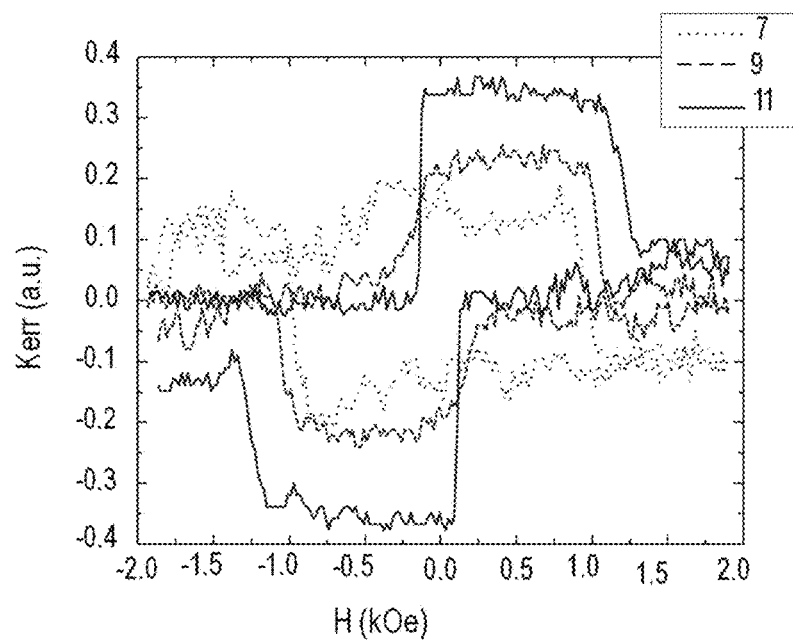

FIG. 20 summarizes the P-MOKE hysteresis loops measured from samples having two layers of different Heusler compounds separated by a non-magnetic spacer layer of IrAl (of varying thickness, t). The stack of these samples was MgO(001)/20 Å MgO/100 Å CoAl/12 Å $Mn_3Sn$/t=7, 9, and 11 Å IrAl/20 Å $Mn_{2.4}Sb$/20 Å MgO/20 Å Ta. For all these samples with t=7, 9, and 11 Å of IrAl, the coupling between the Heusler layers is anti-ferromagnetic.

Figure 21:
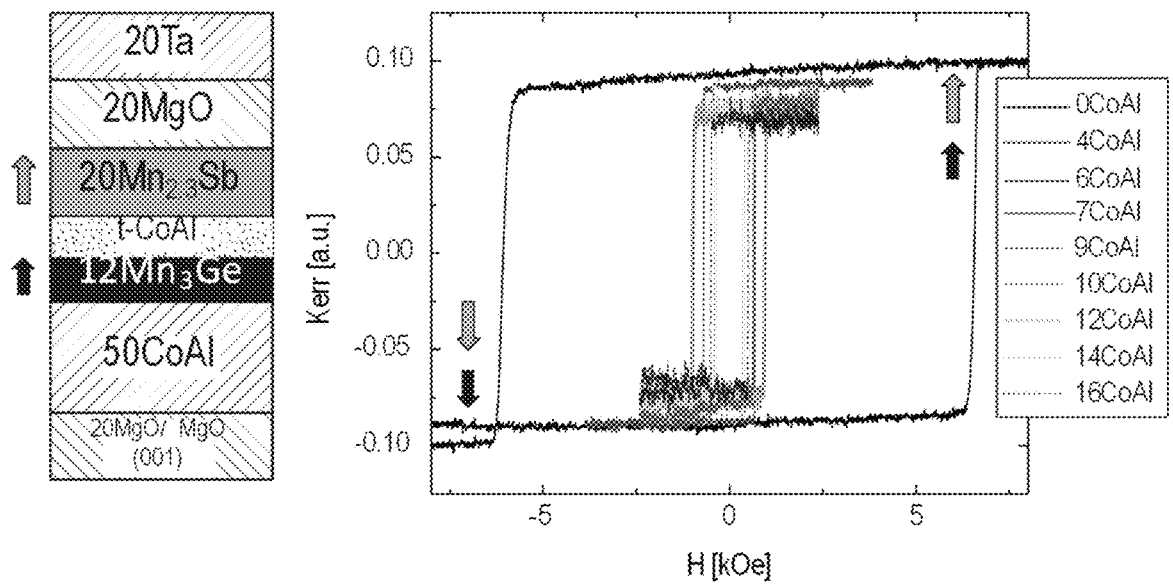
FIG. 21 P-MOKE hysteresis loops of embodiments of Heusler stacks (e.g. left hand side of FIG. 21) having different CoAl spacer layer thicknesses, up to 16 Å.

FIG. 21 compares the P-MOKE hysteresis loops measured from samples with two Heusler compound layers separated by a non-magnetic spacer layer of CoAl. The spacer layer thickness t is varied from 0 to 16 Å (t=0, 4, 6, 7, 9, 10, 12, 14 and 16 Å). The stack of these samples was MgO(001)/20 Å MgO/50 Å CoAl/12 Å $Mn_3Ge$/t CoAl/20 Å $Mn_{2.3}Sb$/20 Å MgO/20 Å Ta. The hysteresis loops obtained for samples with a CoAl spacer layer show a single square hysteresis loop at all CoAl thicknesses studied, which is different from the hysteresis loops obtained for samples with an IrAl spacer layer. The Heusler compound layers separated by the CoAl spacer layer are coupled ferromagnetically for all thicknesses, and there is no evidence that an SAF structure is formed.

Figure 22:
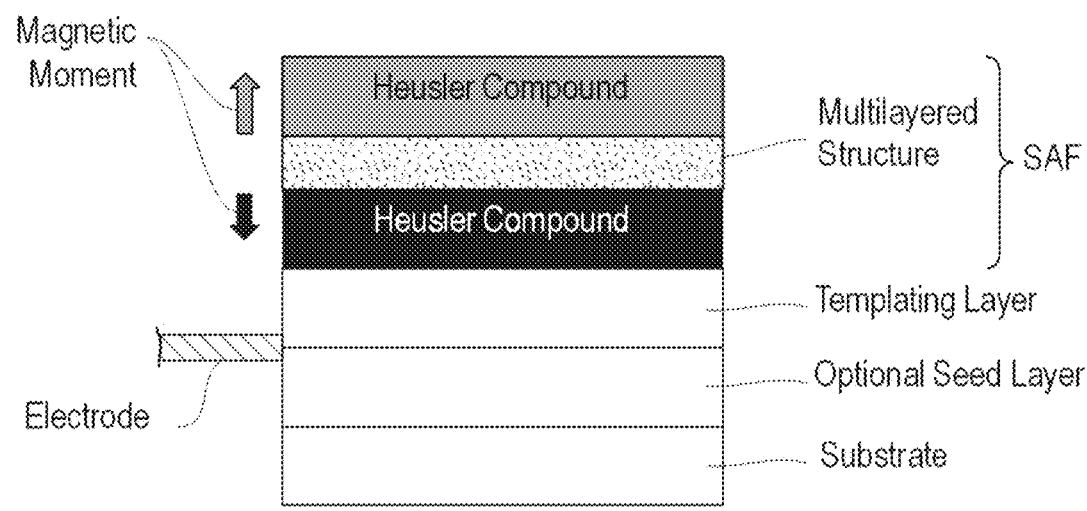
FIG. 22 illustrates an embodiment of a synthetic antiferromagnetic (SAF) structure that incorporates the templating and Heusler layers described herein, in which the magnetic moments of the Heusler layers are perpendicular to a multilayered structure that separates the Heusler layers.
Figure 23:
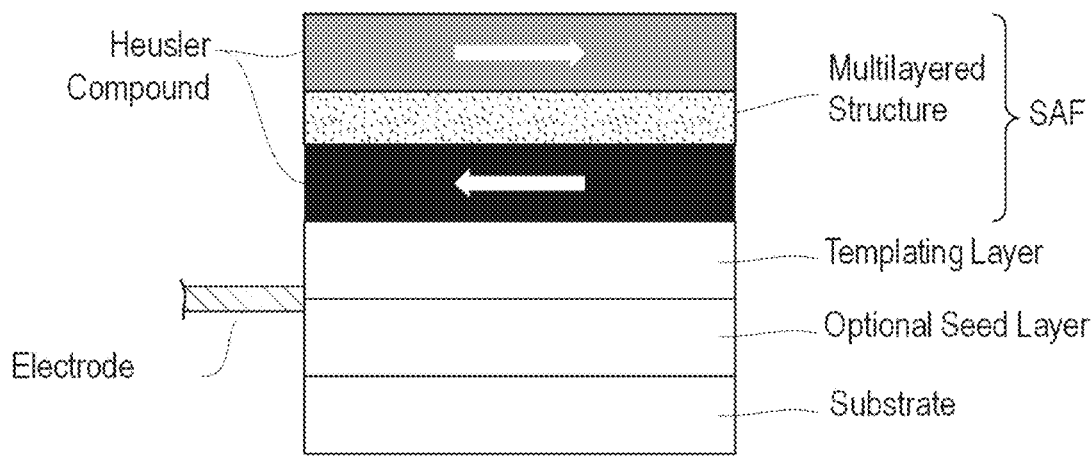
FIG. 23 illustrates an embodiment of a SAF that incorporates the templating and Heusler layers described herein, in which the magnetic moments of the Heusler layers are parallel to a multilayered structure that separates the Heusler layers.
Figure 24:
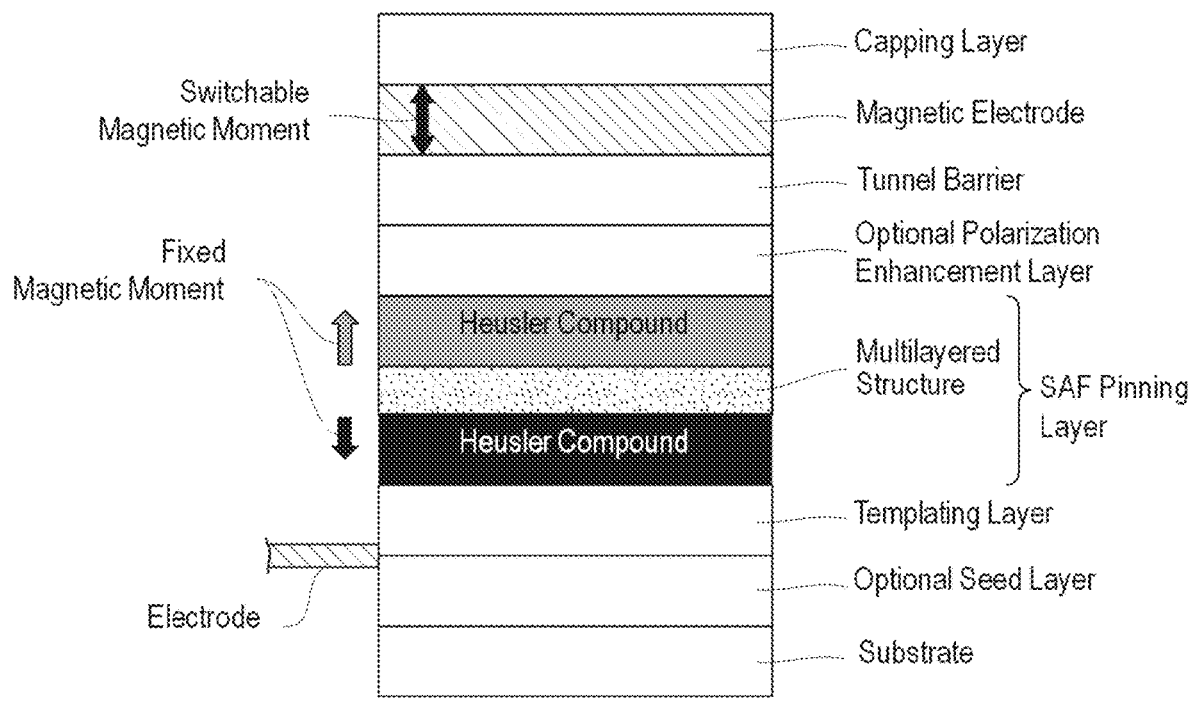
FIG. 24 illustrates an embodiment of a magnetic tunnel junction device that incorporates the templating and Heusler layers described herein, thereby forming a memory element that includes an SAF.

A structure comprising a templating layer and a Heusler SAF, grown on a substrate with an optional seed layer, can be used to fabricate racetrack memory devices (e.g. the devices depicted in FIGS. 22 and 23). Magnetic domain walls may be moved along such a racetrack. Data may be read out of (and stored in) the racetrack by interrogating (or changing) the orientation of the magnetic moment of the magnetic material between adjacent domain walls within the racetrack.

FIG. 22 shows a synthetic antiferromagnet that employs magnetic Heusler layers, such as those described herein. The top three layers of the structure shown in FIG. 22 are now described in turn. The bottom-most of these three structures is a first magnetic layer that includes a Heusler compound (and/or an $L1_0$ compound, such as one or more of MnGa, MnAl, FeAl, MnGe, MnSb, and MnSn).

Overlying the first magnetic layer is a first multi-layered structure that is non-magnetic at room temperature; the first multi-layered structure (i) overlies the first magnetic layer and (ii) includes alternating layers of D' and E', in which E' comprises a member selected from a first group consisting of Al, Ga, Ge, and combinations thereof. The composition of the first multi-layered structure can be represented by $D'_{1-y}E'_y$, with y being in the range from at least 0.4 to not more than 0. (e.g. at least 0.47 to not more than 0.54), and the selected member of the first group representing at least 50 atomic percent of E'. On the other hand, D' comprises a member selected from a second group consisting of Ir and an IrRu alloy, in which the selected member of the second group represents at least 50 atomic percent of D'.

Overlying the first multi-layered structure is a second magnetic layer that includes a Heusler compound (and/or an $L1_0$ compound, such as those described above in connection with the first magnetic layer). The second magnetic layer is in contact with and overlies the first multi-layered structure. Together, the first magnetic layer, the first multi-layered structure, and the second magnetic layer (the top three layers shown in FIG. 22) form a synthetic antiferromagnet (SAF).

In some embodiments, a second multi-layered structure underlies and is contact with the SAF (e.g. the templating layer of FIG. 22). This second multi-layered structure acts as a templating layer for the SAF. It is non-magnetic at room temperature and includes alternating layers of D and E, in which E comprises a member selected from a third group consisting of Al, Ga, Ge, and combinations thereof. The composition of the second multi-layered structure is represented by $D_{1-x}E_x$, with x being in the range from 0.4 to not more than 0.6 (e.g. 0.47 to 0.54), and the selected member of the third group represents at least 50 atomic percent of E (i.e. E includes at least fifty atomic percent of Al, Ga, Ge, or a combination thereof). D comprises a member selected from a fourth group consisting of Ir, Co, Ru, and combinations thereof, wherein the selected member of the fourth group represents at least 50 atomic percent of D (i.e. D includes at least fifty atomic percent of Ir, Co, Ru, or a combination thereof). This second multi-layered structure underlies and contacts the first magnetic layer.

In the device of FIG. 22, the magnetic moments of the first and second magnetic layers are substantially perpendicular to the interfaces between (i) the first multi-layered structure and (ii) the first and second magnetic layers, respectively. In FIG. 23, a similar device is shown in which the magnetic moments of the first and second magnetic layers are substantially parallel to the interfaces between (i) the first multi-layered structure and (ii) the first and second magnetic layers, respectively. The devices of FIGS. 22 and 23 are otherwise identical in some embodiments. Note that as with SAF structures generally, the magnetic moments of the first and second magnetic layers are substantially anti-parallel to each other.

In some embodiments, the devices of FIGS. 22 and 23 have one or more of the following properties. The thickness of each of the first and second magnetic layers may be less than 5 nm or even 3 nm, whereas the thickness of the first multi-layered structure may be in the range of 3 to 11 Å. In some embodiments, the first multi-layered structure has a thickness of at least eight Angstroms and not more than ten Angstroms. The first and second magnetic layers include Heusler compounds (optionally doped with Co) independently selected from the group consisting of $Mn_{3.1-x}Ge$, $Mn_{3.1-x}Sn$, and $Mn_{3.1-x}Sb$ (with x being in the range from 0 to 1.1 in the case of $Mn_{3.1-x}Sb$, and with x being in the range from 0 to 0.6 for $Mn_{3.1-x}Ge$ and $Mn_{3.1-x}Sn$). In some embodiments, the first and/or the second magnetic layers may include a ternary Heusler compound, such as $Mn_{3.1-x}Co_{1.1-y}Sn$, in which x≤1.2 and y≤1.0. In some embodiments, the first and/or the second magnetic layers may include $L1_0$ compounds such as MnAl alloys, MnGa alloys, MnSn alloys, MnGe alloys, and FeAl alloys.

In some embodiments of the structures shown in FIGS. 22 and 23, at least one of E and E' is an AlGe alloy and/or an AlGa alloy. Alternatively, at least one of E and E' includes an alloy selected from the group consisting of AlSn, AlGe, AlGaGe, AlGaSn, AlGeSn, and AlGaGeSn. Also, a seed layer may be used advantageously over the substrate. The devices of FIGS. 22 and 23 may be used as memory elements, for example, as part of a racetrack memory device.

The structures described above in FIGS. 22 and 23 can also form part of an MRAM element. Specifically, when additional components are introduced, such as those shown in FIG. 24, an MRAM element may be formed, in which current passes through the tunnel barrier and adjoining elements, in turn. As with MRAM memory elements generally, a tunnel barrier (or other nonmagnetic layer) is situated between two magnetic electrodes, one of which has a fixed magnetic moment and the other of which has a magnetic moment that is switchable, thereby permitting the recording and erasing of data. Unlike conventional MRAM elements, however, the magnetic layers of FIG. 24 having fixed magnetic moments (e.g. within the SAF pinning layer) each comprise a Heusler compound layer and are separated by a non-magnetic spacer. The Heusler layers, which may be either ferro- or ferri-magnetic, overlie a templating layer which in turn overlies a substrate; the Heusler layers have their respective magnetic moments oriented perpendicular to the layer plane (or in plane). In some embodiments, a Heusler based SAF structure may be used as a storage layer. An optional seed layer may be interposed between the substrate and the templating layer. An optional polarization layer may be used to increase performance, which may include Fe, a CoFe alloy, and/or $Co_2MnSi$. The tunnel barrier may be MgO (001), although other (001)-oriented tunnel barriers may be used, such as CaO and LiF. Alternatively, $MgAl_2O_4$ can be used as a tunnel barrier; its lattice spacing can be selected by controlling the Mg—Al composition to result in better lattice matching with the Heusler compounds (e.g., the composition of this tunnel barrier can be represented as $Mg_{1-z}Al_{2+(2/3)z}O_4$, wherein $-0.5<z<0.5$). The magnetic electrode overlying the tunnel barrier may be advantageously switchable and may comprise Fe, a CoFe alloy, and/or a CoFeB alloy, for example. The capping layer may include Mo, W, Ta, Ru, or a combination thereof. Current may be induced by applying a voltage between the two magnetic electrodes, which are separated by the tunnel barrier.

The various layers described herein may be deposited through any one or more of various methods, including magnetron sputtering, electrodeposition, ion beam sputtering, atomic layer deposition, chemical vapor deposition, and thermal evaporation.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

TABLE 1

| Target Material | Target to Substrate Distance | Ir-RBS (%) | Al-RBS (%) |
|---|---|---|---|
| IrAl | 135 mm | 52.5 | 47.5 |
| IrAl | 125 mm | 49.9 | 50.1 |
| IrAl | 120 mm | 49.5 | 50.5 |
| IrAl | 113 mm | 46.6 | 53.4 |

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A device, comprising:
    a templating structure including D and E, a ratio of D to E being represented by $D_{1-x}E_x$, with x being at least 0.4 and not more than 0.6, E including a main constituent, the main constituent including at least one of Al, Ga, and Ge, E including at least fifty atomic percent of the main constituent, D including at least one constituent that includes Ir, D including at least 50 atomic percent of the at least one constituent, the templating structure being nonmagnetic at room temperature; and
    a magnetic layer on the templating structure, the magnetic layer including at least one of a Heusler compound and an $L1_0$ compound, the magnetic layer being in contact with the templating structure.

2. The device of claim 1, wherein the templating structure includes alternating layers of D and E.

3. The device of claim 2, wherein x is at least 0.47 and not more than 0.54.

4. The device of claim 2, wherein the templating structure has a thickness of at least thirty Angstroms and not more than six hundred Angstroms such that the templating structure has a lattice constant of at least 2.8 Angstroms and not more than 3.05 Angstroms.

5. The device of claim 2, wherein the magnetic layer has a thickness of not more than five nanometers.

6. The device of claim 5, wherein the magnetic layer has a thickness of not more than one unit cell.

7. The device of claim 2, wherein the magnetic layer includes at least one of $Mn_{3.1-y}Ge$, $Mn_{3.1-y}Sn$, $Mn_{3.1-y}Sb$, $Mn_{3.1-s}Co_{1.1-t}Sn$, a MnGa alloy, a MnAl alloy, an FeAl alloy, a MnGe alloy, a MnSb alloy, and a MnSn alloy, with y being at least 0 and not more than 1.1, and with s being greater than zero and not more than 1.2 and t being greater than zero and not more than 1.0.

8. The device of claim 1, further comprising:
    an additional magnetic layer; and
    a tunneling barrier layer between the additional magnetic layer the magnetic layer.

9. The device of claim 1, wherein the magnetic layer is magnetic as-deposited at room temperature.

10. A device, comprising:
    a templating structure including D and E, a ratio of D to E being represented by $D_{1-x}E_x$, with x being at least 0.4 and not more than 0.6, E including a main constituent, the main constituent including at least one of Al, Ga, and Ge, E including at least fifty atomic percent of is the main constituent, D including at least one constituent that includes Ir, D including at least 50 atomic percent of the at least one constituent, the templating structure being nonmagnetic at room temperature, the templating structure having a thickness of at least thirty Angstroms and not more than six hundred Angstroms such that the templating structure has a lattice constant of at least 2.8 Angstroms and not more than 3.05 Angstroms; and
    a magnetic layer on the templating structure, the magnetic layer including at least one of a Heusler compound and an $L1_0$ compound, the magnetic layer being in contact with the templating structure and being magnetic as-deposited at room temperature.

11. A method, comprising:
    providing a templating structure including D and E, a ratio of D to E being represented by $D_{1-x}E_x$, with x being at least 0.4 and not more than 0.6, E including a main constituent, the main constituent including at least one of Al, Ga, and Ge, E including at least fifty atomic percent of the main constituent, D including at least one constituent that includes Ir, D including at least 50 atomic percent of the at least one constituent, the templating structure being nonmagnetic at room temperature; and
    providing a magnetic layer on the templating structure, the magnetic layer including at least one of a Heusler compound and an $L1_0$ compound, the magnetic layer being in contact with the templating structure.

12. The method of claim 11, wherein providing the templating structure includes:
depositing alternating layers of D and E.

13. The method of claim 12, wherein x is at least 0.47 and not more than 0.54.

14. The method of claim 12, further comprising:
selecting a target lattice constant of the magnetic layer; and wherein the providing the templating structure further includes
depositing the templating structure to a thickness of at least thirty Angstroms and not more than six hundred Angstroms such that the templating structure has a lattice constant of at is least 2.8 Angstroms and not more than 3.05 Angstroms, the lattice constant corresponding to the target lattice constant.

15. The method of claim 12, wherein the magnetic layer has a thickness of not more than five nanometers.

16. The method of claim 15, wherein the magnetic layer has a thickness of not more than one unit cell.

17. The method of claim 12, wherein the magnetic layer includes at least one of $Mn_{3.1-y}Ge$, $Mn_{3.1-y}Sn$, $Mn_{3.1-y}Sb$, $Mn_{3.1-s}Co_{1.1-t}Sn$, a MnGa alloy, a MnAl alloy, an FeAl alloy, a MnGe alloy, a MnSb alloy, and a MnSn alloy, with y being at least 0 and not more than 1.1, and with s being greater than zero and not more than 1.2 and t being greater than zero and not more than 1.0.

18. The method of claim 11, further comprising:
providing an additional magnetic layer; and
providing a tunneling barrier layer between the additional magnetic layer the magnetic layer.

19. The method of claim 11, wherein providing the magnetic layer further includes:
depositing the magnetic layer at room temperature.

20. The method of claim 11, wherein the providing the templating structure further includes:
annealing the templating structure at an anneal temperature of at least two hundred degrees Celsius.

* * * * *

UNITED STATES PATENT AND TRADEMARK OFFICE
CERTIFICATE OF CORRECTION

PATENT NO. : 11,804,321 B2
APPLICATION NO. : 17/100719
DATED : October 31, 2023
INVENTOR(S) : Jaewoo Jeong et al.

It is certified that error appears in the above-identified patent and that said Letters Patent is hereby corrected as shown below:

In the Claims

In Column 18, Line 32, in Claim 8, delete "layer the magnetic layer." and insert -- layer and the magnetic layer. --.

In Column 18, Line 40, in Claim 10, after "of" delete "is".

In Column 19, Line 14, in Claim 14, after "at" delete "is".

In Column 20, Line 11, in Claim 18, delete "magnetic layer the magnetic layer." and insert -- magnetic layer and the magnetic layer. --.

Signed and Sealed this
Thirtieth Day of January, 2024

Katherine Kelly Vidal
*Director of the United States Patent and Trademark Office*